United States Patent
Hsu et al.

(10) Patent No.: US 11,024,513 B2
(45) Date of Patent: Jun. 1, 2021

(54) METHODS FOR MINIMIZING SIDEWALL DAMAGE DURING LOW K ETCH PROCESSES

(71) Applicants: L'Air Liquide, Société Anonyme pour l'Etude et l'Exploitation des Procédés Georges CLuadeq, Paris (FR); Air Liquide Electronics U.S. LP, Dallas, TX (US)

(72) Inventors: Chih-Yu Hsu, Tsukuba (JP); Peng Shen, Tsukuba (JP); Nathan Stafford, Damascus, OR (US)

(73) Assignee: Air Liquide Electronics U.S. LP, Dallas, TX (US)

(*) Notice: Subject to any disclaimer, the term of this patent is extended or adjusted under 35 U.S.C. 154(b) by 0 days.

(21) Appl. No.: 16/474,667

(22) PCT Filed: Dec. 29, 2017

(86) PCT No.: PCT/US2017/069075
§ 371 (c)(1),
(2) Date: Jun. 28, 2019

(87) PCT Pub. No.: WO2018/126202
PCT Pub. Date: Jul. 5, 2018

(65) Prior Publication Data
US 2019/0326126 A1    Oct. 24, 2019

Related U.S. Application Data

(63) Continuation of application No. 15/396,486, filed on Dec. 31, 2016, now abandoned.

(51) Int. Cl.
*H01L 21/311* (2006.01)
*H01L 21/02* (2006.01)
*H01L 21/768* (2006.01)

(52) U.S. Cl.
CPC .. *H01L 21/31116* (2013.01); *H01L 21/02063* (2013.01); *H01L 21/31144* (2013.01); *H01L 21/76802* (2013.01); *H01L 21/76898* (2013.01)

(58) Field of Classification Search
CPC .................................................. H01L 21/31116
See application file for complete search history.

(56) References Cited

U.S. PATENT DOCUMENTS 2,704,769 A   3/1955   La Zerte
2,730,543 A   1/1956   Rendall
(Continued)

FOREIGN PATENT DOCUMENTS

| EP | 1 691 410 | 8/2006 |
|---|---|---|
| JP | 2002 289577 | 10/2002 |
| JP | 2005 142255 | 6/2005 |

OTHER PUBLICATIONS

Flamm et al., 'Plasma Etching—An Introduction—Plasmas, Materials Interactions', 1989, pp. 10-13, Academic Press, Inc., San Diego, CA, USA.
(Continued)

*Primary Examiner* — Selim U Ahmed
*Assistant Examiner* — Evan G Clinton
(74) *Attorney, Agent, or Firm* — Yan Jiang

(57) ABSTRACT

Methods for minimizing sidewall damage during low k etch processes are disclosed. The methods etch the low k layers f using the plasma activated vapor of an organofluorine compound having a formula selected from the group consisting of N≡C—R; (N@C—)—(R)—(—C≡N); Rx[-C≡N (Rz)]y; and R(3-a)-N—Ha, wherein a=1-2, x=1-2, y=1-2, z=0-1, x+z=1-3, and each R independently has the formula $H_aF_bC_c$ with a=0-11, b=0-11, and c=0-5.

8 Claims, 15 Drawing Sheets

(56) References Cited

U.S. PATENT DOCUMENTS

| | | |
|---|---|---|
| 3,585,218 A | 6/1971 | Talbott |
| 3,671,509 A | 6/1972 | Howard, Jr. |
| 5,242,538 A | 9/1993 | Hamrah et al. |
| 5,814,563 A | 9/1998 | Ding et al. |
| 5,843,847 A | 12/1998 | Pu et al. |
| 6,387,287 B1 | 5/2002 | Hung et al. |
| 6,413,877 B1 | 7/2002 | Annapragada |
| 6,508,948 B2 | 1/2003 | Felker et al. |
| 6,569,774 B1 | 5/2003 | Trapp |
| 6,777,344 B2 | 8/2004 | Annapragada et al. |
| 7,311,852 B2 | 12/2007 | Li et al. |
| 2002/0190027 A1 | 12/2002 | Felker et al. |
| 2003/0162395 A1 | 8/2003 | Trapp |
| 2004/0211517 A1 | 10/2004 | Annapragada et al. |
| 2006/0062914 A1 | 3/2006 | Garg et al. |
| 2010/0105595 A1 | 4/2010 | Lee |
| 2011/0180941 A1 | 7/2011 | Hwang et al. |
| 2014/0012033 A1 | 1/2014 | Buisine |
| 2014/0199851 A1 | 7/2014 | Nemani et al. |
| 2015/0371869 A1* | 12/2015 | Surla .............. H01L 21/02274 438/723 |

OTHER PUBLICATIONS

Hsu, C.-Y. et al., "Methodologies for evaluating post-etching damage in ultra-low-k dielectrics and new chemistry for damage reduction," presentation at IEEE International Interconnect Technology Conference (IITC 2017), May 16-18, 2017, Hsinchu, Taiwan, 3 pgs.

Khandelwal et al., 'Dry Removal Technology for Advanced CMOS Devices', Nanochip Technology Journal, 2013, vol. 11, Issue 2, pp. 17-19, Applied Materials, Inc.

Miyawaki, et al., 'Etching Enhancement Followed by Nitridation on Low-k SiOCH Film in Ar/C5 F 10O Plasma', JJAP, 2013, pp. 020204-1-020204-4, vol. 52.

Nagai et al., 'Plasma Induced Subsurface Reactions for Anisotropic Etching of Organic Low Dielectric Film Employing N2 and H2 Gas Chemistry', JJAP, 2003, pp. L 212-L 214, vol. 42.

Xu et al., 'Study of plasma-induced damage of porous ultralow-k dielectric films during photoresist stripping', JVST B, Jan./Feb. 2007, pp. 156-163, vol. 25 (1).

Yang et al., 'Passivation Effect during the C4F8 + N2 Etch Process for SiOCH Low-k Films', JKPS, Jun. 2008, pp. 1786-1791, vol. 52 (6).

International Search Report and Written Opinion for corresponding PCT/US2017/069075, dated Apr. 10, 2018.

International Search Report and Written Opinion for related PCT/US2016/049479, dated Nov. 2, 2016.

Hsu, C.-Y. et al., Damage reduction towards plasma etching of low-k dielectrics with new chemistries, presentation at IEEE International Interconnect Technology Conference (IITC 2017), May 16-18, 2017, Hsinchu, Taiwan, 2 pgs.

* cited by examiner

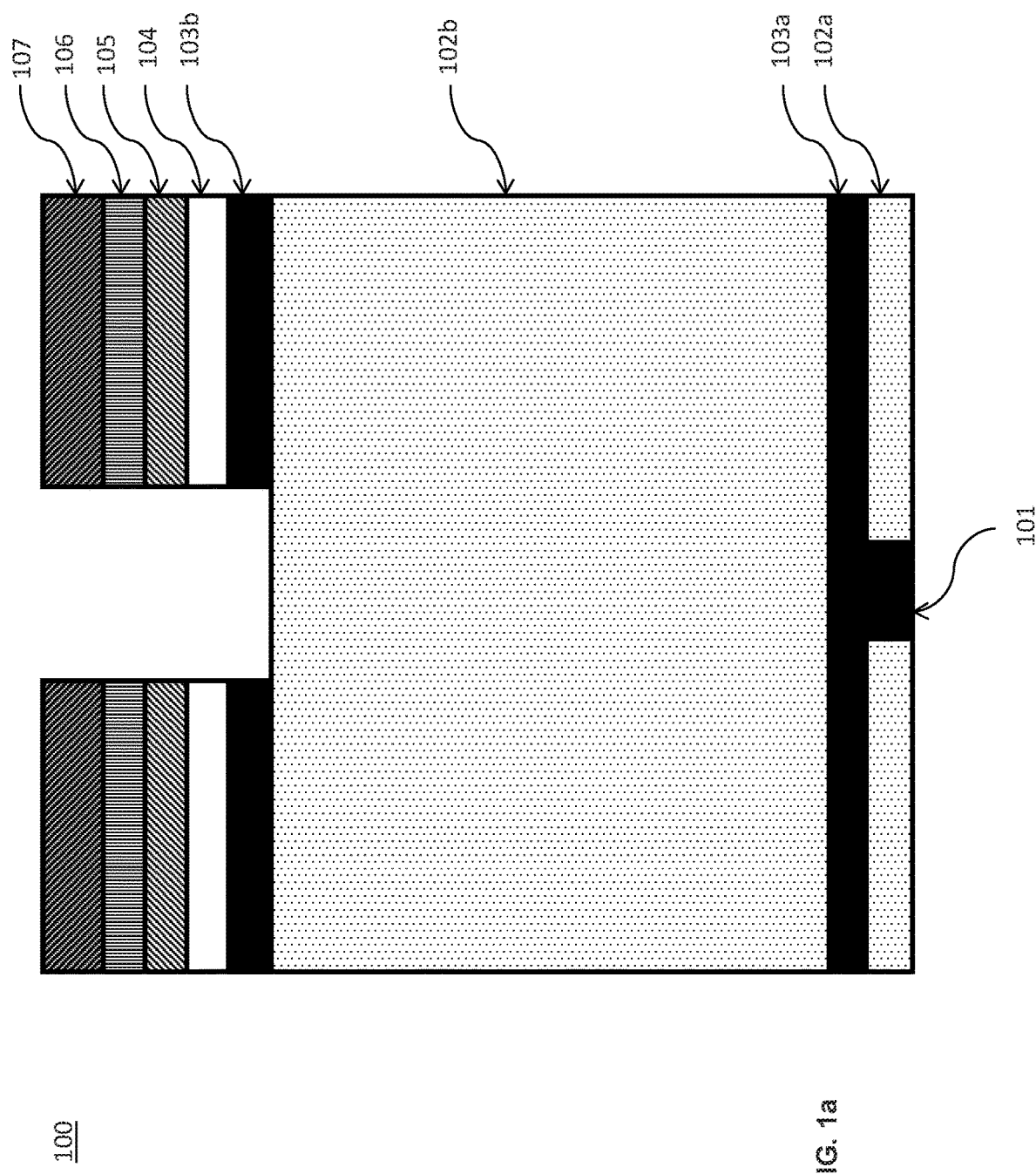

METHODS FOR MINIMIZING SIDEWALL DAMAGE DURING LOW K ETCH PROCESSES

CROSS REFERENCE TO RELATED APPLICATIONS

The present application is a 371 of International PCT Application PCT/US2017/069075, filed Dec. 29, 2017, which claims priority to U.S. patent application Ser. No. 15/396,486 filed Dec. 31, 2016, the entire contents of which are incorporated herein by reference in its entirety for all purposes.

TECHNICAL FIELD

Methods for minimizing sidewall damage during low k etch processes are disclosed. The methods etch the low k layers using the plasma activated vapor of an organofluorine compound having a formula selected from the group consisting of N≡C—R; (N≡C—)—(R)—(—C≡N); $R_x[—C≡N(R_z)]_y$; and $R_{(3-a)}$—N—$H_a$, wherein a=1-2, x=1-2, y=1-2, z=0-1, x+z=1-3, and each R independently has the formula HaFbCc with a=0-11, b=0-11, and c=0-5.

BACKGROUND

The transistors on a microprocessor are connected to form very complex circuitry using copper wiring. The copper wires are insulated using a low-k dielectric material.

The low-k dielectric material is typically a hydrogenated carbon-doped silicon oxide (SiCOH), wherein the free surfaces are terminated with methyl groups ($CH_3$) bound to silicon. Processing steps, such as etching which is typically performed by reactive ion etching, effectively remove the methyl terminations, leaving either dangling bonds or hydroxyl groups (Si—OH). As a result, the film becomes more hydrophilic and can readily absorb moisture. This damage, so-called plasma-induced damage, in turn leads to an increase in the dielectric constant, the degree of which depends on the severity of the damaging process. Such damage degrades the performance of the resulting transistor device.

Another effect of carbon depletion is its impact on critical dimensions. For instance, the etching process used to form a trench through the low-k film would tend to leave the trench walls depleted of carbon. In subsequent wet stripping or cleaning processes the trench can be significantly broadened, a problem that becomes even more critical as feature size is reduced.

Ji et al. (U.S. Pat. No. 5,814,563) disclose using a mixture of a fluorohydrocarbon, carbon-oxygen, and $NH_3$-generating gases to achieve high selectivity of dielectric (such as SiO and SiN) to p-Si layers. Shane (US Pat App Pub No 2003/0162395) discloses addition of a nitrogen-comprising gas to a fluorocarbon to deposit a polymer on the mask to improve selectivity while etching silicon dioxide layer. Nemani et al. (US Pat App Pub No 2014/0199851) disclose using a plasma process performed by flowing $NF_3$ and $NH_3$ to remove the modified portion of silicon nitride layer to pattern a silicon nitride dielectric film. Hamrah et al. (U.S. Pat. No. 5,242,538) discloses using $CF_4$ and $NH_3$ etching gases and selectivity of silicon oxide to polysilicon of up to 100:1 was observed. Pu et al. (U.S. Pat. No. 5,843,847) also discloses adding an additional nitrogen gas to a fluorinated etching gas to assist in feature dimensional control.

Nitrogen containing compounds have been used as etching gases. For example, Khandelwal, et al. ("Dry removal technology for advanced CMOS devices", Nanochip Tech. J., vol. 11, issue 2, 2013, p 17-19) disclose an in-situ dry removal process using $NH_4F$ as etchant. Garg et al. (US Pat App Pub No 2006/0062914) disclose an activated reactive gas to treat the surface of a substrate. Garg et al. describe at paragraph [0019] that the activated reactive gas may include a large variety of fluorine-containing gases, including $C_3F_3N_3$, fluoroamines such as $CF_5N$, fluoronitriles such as $C_2F_3N$, $C_3F_6N$, and $CF_3NO$. Felker et al. (U.S. Pat. No. 6,508,948) disclose perfluorinated heteroaromatic amine etching compounds, including cyanuric fluoride compounds. One disclosed cyanuric fluoride compound is pentafluoropyridine $C_5F_5N$.

U.S. Pat. Nos. 6,569,774 and 7,153,779 to Trapp disclose a plasma etch process for forming a high aspect ratio contact opening through a silicon oxide layer. At least one etch gas is used that includes one or more nitrogen-comprising gases to deposit a polymeric surface material during the etching for maintaining a masking layer over the silicon oxide layer.

US Pat App Pub No 2015/0371869 to Surla et al. discloses a method for etching silicon-containing films using organofluorine compounds containing at least one C≡N or C═N functional groups.

U.S. Pat. No. 6,413,877 to Annapragada discloses a method for making an etched organo-silicate-glass (OSG) layer over a substrate. The patterned resist mask is stripped without stripping the sidewalls using a medium density plasma of $N_2/O_2$, $N_2/H_2$, or $N_2/NH_3$.

U.S. Pat. No. 6,777,344 and US Pat App Pub No 2004/0211517 to Annapragada et al. disclose a process for stripping photoresist from a semiconductor wafer formed with at least one layer of OSG dielectric and a method of etching a stack using a fluorine-containing gas and an ammonia-containing gas, respectively.

Nitrogen plasma or co-reactant ($N_2$, $NH_3$) with fluorocarbon gases for low-k etching/stripping are also report in several studies. See, e.g., Y. Miyawaki et al., JJAP 52 (2013) 020204; SK Yang et al., JKPS 52 (2008) 1786; H. Nagai et al., JJAP 42 (2003) L212; and X. Su, JVST B 25 (2007) 156.

Thus, a need remains for improved low k plasma etching processes, which reduce damage and carbon loss in the low k film during the low k etch process, while maintaining profile control and selectivity to the mask and etch stop layers.

SUMMARY

Methods for minimizing sidewall damage during low k etch processes are also disclosed. A patterned mask layer is deposited on a low k layer. The patterned mask layer has an opening that defines an area to produce an aperture in the low k layer. The low k layer is etched with a plasma activated vapor of a nitrogen containing etching composition to produce an etched low k layer having the aperture having a first defined sidewall width. The nitrogen containing etching composition comprises an organofluorine compound having a formula selected from the group consisting of N≡C—R; (N≡C—)—(R)—(—C≡N); $R_x[—C≡N(R_z)]_y$; and $R_{(3-a)}$—N—$H_a$, wherein a=1-2, x=1-2, y=1-2, z=0-1, x+z=1-3, and each R independently has the formula HaFbCc with a=0-11, b=0-11, and c=0-5. Damaged low k layer is removed from the aperture to produce a second defined sidewall width. The difference between the first and second defined sidewall widths ranges between 0 nm to 11 nm.

Either of the disclosed processes may include one or more of the following aspects:

the organofluorine compound containing a C≡N functional group;

the organofluorine compound having the formula N≡C—R, wherein R has the formula HaFbCc and a=0, b=1-11, and c=1-5;

the organofluorine compound being trifluoroacetonitrile (C$_2$F$_3$N) having the formula:

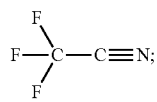

the organofluorine compound being nonafluoropentanitrile (C$_5$F$_9$N) having the formula:

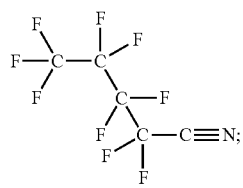

the organofluorine compound being pentafluoroallyl cyanide (C$_4$F$_5$N) having the formula:

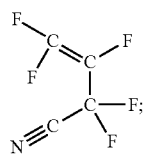

the organofluorine compound having the formula N≡C—R, wherein R has the formula H$_a$F$_b$C$_c$ and a=1-11, b=1-11, and c=1-5;

the organofluorine compound being difluoroacetonitrile (C$_2$HF$_2$N) having the formula

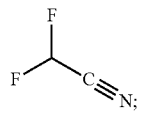

the organofluorine compound being 2,3,3,3-tetrafluoropropionitrile (C$_3$HF$_4$N) having the formula

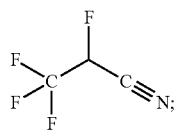

the organofluorine compound being 2,2,3,3-tetrafluoropropionitrile (C$_3$HF$_4$N) having the formula

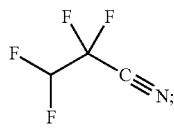

the organofluorine compound being 4,4,4-Trifluorocrotono-nitrile (C$_4$H$_2$F$_3$N) having the formula

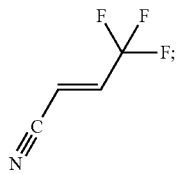

the organofluorine compound being 3,3,3-Trifluoropropionitrile (C$_3$H$_2$F$_3$N) having the formula

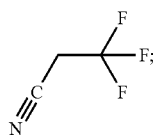

the organofluorine compound being fluoroacetonitrile (C$_2$H$_2$FN) having the formula

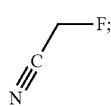

the organofluorine compound having the formula (N≡C—)—(R)—(—C≡N), wherein R has the formula H$_a$F$_b$C$_c$ with a=0, b=1-11, and c=1-5;

the organofluorine compound being octafluorohexane-1,6-dinitrile (C$_6$F$_8$N$_2$) having the formula

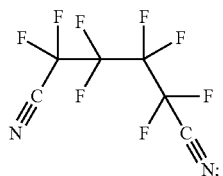

the organofluorine compound being 1,1-bis(trifluoromethyl)-2,2-dicyanoethylene (C$_6$F$_6$N$_2$) having the formula

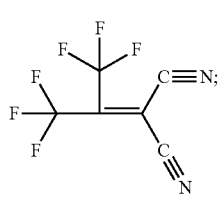 [SMILES: N#CC(C#N)=C(C(F)(F)F)C(F)(F)F]

the organofluorine compound having the formula (N≡C—)—(R)—(—C≡N), wherein R has the formula $H_aF_bC_c$ with a=1-11, b=1-11, and c=1-5;

the organofluorine compound being 2-[1-(difluoromethyl)-2,2,2-trifluoroethylidene]-propanedinitrile ($C_6HF_5N_2$) having the formula

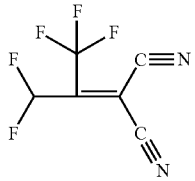

the organofluorine compound containing a C═N functional group;

the organofluorine compound having the formula $R_x[—C═N(R_z)]_y$, wherein x=1-2, y=1-2, z=0-1, x+z=1-3, and each R independently has the formula $H_aF_bC_c$ with a=0, b=1-11, and c=0-5;

the organofluorine compound being N,1,1,1,3,3,3-heptafluoro-propanamine ($C_3F_7N$) having the formula

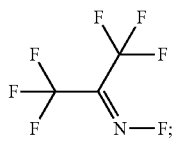

the organofluorine compound having the formula $R_x[—C═N(R_z)]_y$, wherein x=1-2, y=1-2, z=0-1, x+z=1-3, and each R independently has the formula $H_aF_bC_c$ with a=0-11, b=0-11, and c=0-5;

the organofluorine compound being hexafluoroacetone imine ($C_3HF_6N$) having the formula

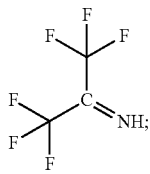

the organofluorine compound being 1,1,1,6,6,6-Hexafluoro-3-azahex-3-ene ($C_5H_5F_6N$) having the formula

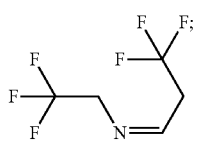

the organofluorine compound containing a C—N functional group;

the organofluorine compound having the formula $R_{(3-a)}$—N—$H_a$, wherein a=1-2 and each R independently has the formula $H_aF_bC_c$ with a=1-11, b=1-11, and c=1-5;

the organofluorine compound being 2,2,2-trifluoroethylamine ($C_2H_4F_3N$) having the formula

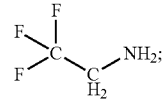

the organofluorine compound being 2,2,3,3,3-pentafluoropropylamine ($C_3H_4F_5N$) having the formula

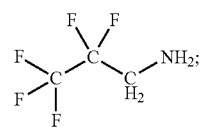

the organofluorine compound being 2,2,3,3,4,4,4-heptafluorobutylamine ($C_4H_4F_7N$) having the formula

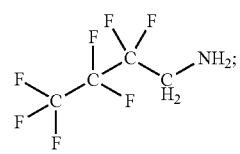

the organofluorine compound being 1,1,1,3,3,3-hexafluoroisopropylamine ($C_3H_3F_6N$) having the formula

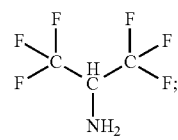

the organofluorine compound being bis(2,2,2-trifluoroethyl)amine ($C_4H_5F_6N$) having the formula

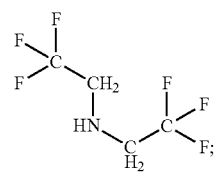

removing residual polymer using Piranha ($H_2SO_4+H_2O_2+H_2O$), SC1 (1:1:100 $NH_4OH:H_2O_2:H_2O$), SC2 (1:1000 HCl:$H_2O$), or HF;

removing the damaged low k layer using Piranha ($H_2SO_4+H_2O_2+H_2O$), SC1 (1:1:100 $NH_4OH:H_2O_2:H_2O$), SC2 (1:1000 HCl:$H_2O$), or HF;

removing the entire damaged low k layer together with removing the residual polymer;

removing a portion of the damaged low k layer together with removing the residual polymer;

the plasma activated vapor of the nitrogen containing etching composition selectively etching the low k layer and not the patterned mask layer;

the plasma activated vapor of the nitrogen containing etching composition exhibiting a selectivity between the low k layer and the patterned mask layer ranging from approximately 20:1 to approximately 120:1;

the plasma activated vapor of the nitrogen containing etching composition exhibiting a selectivity between the low k layer and the patterned mask layer ranging from approximately 70:1 to approximately 120:1;

the activated nitrogen containing etching composition reacting with the low k layer to form volatile by-products;

the volatile by-products being removed from the reaction chamber;

further comprising introducing an inert gas during the etching step;

the inert gas being selected from the group consisting of He, Ar, Xe, Kr, and Ne;

the inert gas being Ar;

mixing the vapor of the nitrogen containing etching composition and the inert gas prior to introduction to the etching step;

introducing the vapor of the nitrogen containing etching composition separately from the inert gas during the etching step;

introducing the inert gas continuously and introducing the vapor of the nitrogen containing etching composition in pulses during the etching step;

the inert gas comprising approximately 0.01% v/v to approximately 99.9% v/v of a total volume of both the vapor of the nitrogen containing etching composition and inert gas introduced during the etching step;

the inert gas comprising approximately 10% v/v to approximately 90% v/v of a total volume of both the vapor of the nitrogen containing etching composition and inert gas introduced during the etching step;

the inert gas comprising approximately 90% v/v to approximately 99% v/v of a total volume of both the vapor of the nitrogen containing etching composition and inert gas introduced during the etching step;

further comprising introducing an oxygen-containing reactant during the etching step;

not introducing an oxygen-containing reactant during the etching step;

the oxygen-containing reactant being selected from the group consisting of $O_2$, COS, CO, $CO_2$, NO, $N_2O$, $NO_2$, $SO_2$, and $O_3$;

the oxygen-containing reactant being $O_2$;

mixing the vapor of the nitrogen containing etching composition and the oxygen-containing reactant prior to the etching step;

introducing the vapor of the nitrogen containing etching composition separately from the oxygen-containing reactant during the etching step;

introducing the oxygen-containing reactant continuously and introducing the vapor of the nitrogen containing etching composition in pulses during the etching step;

the oxygen-containing reactant comprising approximately 0.01% v/v to approximately 99.9% v/v of a total volume of the vapor of the nitrogen containing etching composition and oxygen-containing reactant introduced during the etching step;

the oxygen-containing reactant comprising approximately 40% v/v to approximately 60% v/v of a total volume of the vapor of the nitrogen containing etching composition and oxygen-containing reactant introduced during the etching step;

the oxygen-containing reactant comprising approximately 0.01% v/v to approximately 10% v/v of a total volume of the vapor of the nitrogen containing etching composition and oxygen-containing reactant introduced during the etching step;

the low k layer comprising a layer of $Si_aO_bC_cH_d$ (where a>0; b, c, and d≥0);

the low k layer comprising oxygen atoms, carbon atoms, hydrogen atoms or combinations thereof;

the low k layer being porous;

the low k layer being selectively etched from an a-C layer;

the low k layer being selectively etched from a photoresist layer;

the low k layer being selectively etched from a silicon nitride layer;

the low k layer being selectively etched from a silicon carbonitride layer;

the low k layer being selectively etched from a polysilicon layer;

the low k layer being selectively etched from a crystalline silicon layer;

the low k layer being selectively etched from a metal contact layer;

the low k layer being selectively etched from a Titanium Nitride layer;

the low k layer being selectively etched from a Tantalum layer;

the low k layer being a silicon oxide layer;

selectively etching the silicon oxide layer from an a-C layer;

selectively etching the silicon oxide layer from a photoresist layer;

selectively etching the silicon oxide layer from a p-Si layer;

selectively etching the silicon oxide layer from a crystalline silicon layer;

selectively etching the silicon oxide layer from a metal contact layer;

selectively etching the silicon oxide layer from a SiN layer;

selectively etching the silicon oxide layer from a SiCN layer;

the silicon-containing film being a SiCOH layer;

selectively etching the SiCOH layer from titanium nitride layer;

selectively etching the SiCOH layer from a-C layer;

selective etching the SiCOH layer from photoresist layer;

selective etching the SiCOH layer from SiN layer;

selective etching the SiCOH layer from SiCN layer;

the aperture having an aspect ratio between approximately 10:1 and approximately 200:1;

the aperture having an aspect ratio between approximately 1:1 and approximately 20:1;

the aperture being a gate trench;

the aperture being a staircase contact;

the aperture being a channel hole;

the aperture being a channel hole having an aspect ratio between approximately 60:1 and approximately 100:1;

the aperture being a channel hole having a diameter ranging from approximately 5 nm to approximately 100 nm;

the aperture being a channel hole having a diameter ranging from approximately 10 nm to approximately 50 nm;

further comprising improving selectivity by introducing an etch gas during the etching step;

further comprising improving etch rate by introducing an etch gas during the etching step;

the etch gas being selected from the group consisting of $cC_4F_8$, $C_4F_8$, $C_4F_6$, $CF_4$, $CH_3F$, $CF_3H$, $CH_2F_2$, COS, $CF_3I$, $C_2F_3I$, $C_2F_5I$, F—C≡N, $CS_2$, $SO_2$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans- $C_4H_2F_6$), 1,1,2,2,3-pentafluorocyclobutane ($C_4H_3F_5$), 1,1,2,2-tetrafluorocyclobutane ($C_4H_4F_4$), or cis-1,1,2,2,3,4-hexafluorocyclobutane (cis-$C_4H_2F_6$);

the etch gas being $cCsF_8$;

the etch gas being $cC_4F_8$;

the etch gas being $C_4F_6$;

mixing the vapor of the nitrogen containing etching composition and the etch gas prior to the etching step;

introducing the vapor of the nitrogen containing etching composition separately from the etch gas during the etching step;

introducing approximately 0.01% v/v to approximately 99.99% v/v etch gas of a total volume of the vapor of the nitrogen containing etching composition and etch gas introduced during the etching step;

activating a plasma by applying RF power;

activating the plasma by a RF power ranging from approximately 25 W to approximately 10,000 W;

performing the etching step at a pressure ranging from approximately 1 mTorr to approximately 10 Torr;

introducing the vapor of the nitrogen containing etching composition into an etching reaction chamber at a flow rate ranging from approximately 0.1 sccm to approximately 1 slm during the etching step;

maintaining the low k layer at a temperature ranging from approximately −196° C. to approximately 500° C.;

maintaining the low k layer at a temperature ranging from approximately −120° C. to approximately 300° C.;

maintaining the low k layer at a temperature ranging from approximately −100° C. to approximately 50° C.; or maintaining the low k layer at a temperature ranging from approximately −50° C. to approximately 40° C.

Also disclosed are nitrogen containing etching compositions comprising an organofluorine compound having a C—N functional group. The disclosed nitrogen containing etching compositions include one or more of the following aspects:

the organofluorine compound having the formula $R_{(3-a)}$—N—$H_a$, wherein a=1-2 and R independently has the formula $H_aF_bC_c$ with a=1-11, b=1-11, and c=1-5;

the organofluorine compound being 2,2,2-trifluoroethylamine ($C_2H_4F_3N$) having the formula

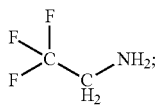

the organofluorine compound being 2,2,3,3,3-pentafluoropropylamine ($C_3H_4F_5N$) having the formula

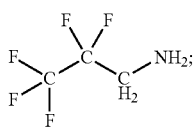

the organofluorine compound being 2,2,3,3,4,4,4-heptafluorobutylamine ($C_4H_4F_7N$) having the formula

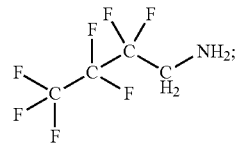

the organofluorine compound being 1,1,1,3,3,3-hexafluoroisopropylamine ($C_3H_3F_6N$) having the formula

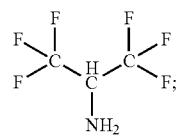

the organofluorine compound being bis(2,2,2-trifluoroethyl)amine ($C_4H_5F_6N$) having the formula

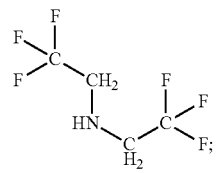

having a purity ranging from approximately 95% to approximately 99.999% by volume;

comprising between approximately 10 parts per trillion to approximately 5% by volume trace gas impurities;

the trace gas impurities comprising water;

the trace gas impurities comprising $CO_2$;

the trace gas impurities comprising $N_2$; or the nitrogen containing etching composition having a water content of less than 20 ppmw.

Notation and Nomenclature

The following detailed description and claims utilize a number of abbreviations, symbols, and terms, which are generally well known in the art. While definitions are typically provided with the first instance of each acronym, for convenience, Table 1 provides a list of the abbreviations, symbols, and terms used along with their respective definitions.

TABLE 1

| | |
|---|---|
| a or an | one or more than one |
| approximately or about | ±10% of the value stated |
| LCD-TFT | liquid-crystal display-thin-film transistor |
| DRAM | dynamic random-access memory |
| FINFET | fin-shaped field-effect transistor |
| Bulk CMOS | Bulk complementary metal-oxide-semiconductor |
| FD-SOI | fully depleted silicon-on-insulator |
| FEOL | front end of the line |
| BEOL | back end of the line |
| TSV | through silicon via |
| OLED | organic light-emitting diode |
| RIE | reactive ion etching |
| CCP | capacitively coupled plasma |

TABLE 1-continued

| | |
|---|---|
| ICP | inductively coupled plasma |
| sccm | standard cubic centimeters per minute |
| slm | standard liter per minute |
| ONON | silicon oxide and silicon nitride alternating layers |
| TCAT | terabit cell array transistor |
| P-BICS | pipe-shaped bit cost scalable |
| QMS | Quadrupole mass spectrometer |
| ARC or BARC | Anti-reflecting coating or Bottom anti-reflecting coating |
| APF or a-C | Amorphous carbon. Trademark of Applied Materials |
| CAS | chemical abstract service |
| PCTFE | Polychlorotrifluoroethene |
| PVDF | polyvinylidene fluoride |
| PTFE | Polytetrafluoroethylene |
| SEM | scanning electron microscope |
| NAND | Not AND or Negative-NAND or Negated AND |
| TEOS | Tetraethylorthosilicate |
| LDTEOS | low deposition rate TEOS |
| BPSG | Borophosphosilicateglass |
| p-Si | poly-silicon |
| XPS | X-ray photoelectron spectroscopy |
| SiN | Silicon nitride |
| SiO | Silicon oxide |

As used herein, the indefinite article "a" or "an" means one or more.

As used herein, "about" or "around" or "approximately" in the text or in a claim means±10% of the value stated.

As used herein, "increase in the dielectric constant" or "increased dielectric constant" in the text or in a claim means before and after etching changes of the k value are ≥0, in which "changes" means increases ≥0 of k value after etching, provided that the k value after etching is higher than or the same as the k value before etching.

As used herein, the term "etch" or "etching" refers to a plasma etch process (i.e., a dry etch process) in which ion bombardment accelerates the chemical reaction in the vertical direction so that vertical sidewalls are formed along the edges of the masked features at right angles to the substrate (Manos and Flamm, Plasma Etching An Introduction, Academic Press, Inc. 1989 pp. 12-13). The etching process produces apertures, such as vias, trenches, channel holes, gate trenches, staircase contacts, capacitor holes, contact holes, etc., in the substrate.

The term "pattern etch" or "patterned etch" refers to etching a non-planar structure, such as a patterned mask layer on a stack of silicon-containing films.

The term "mask" refers to a layer that resists etching. The mask layer may be located above the layer to be etched.

The term "etch stop" refers to a layer that resists etching located below the layer to be etched that protects layers underneath.

The term "device channel" refers to layers that are part of actual device and any damage to it will affect device performance.

The term "aspect ratio" refers to a ratio of the height of a trench (or via) to the width of the trench (or the diameter of the via).

The term "selectivity" means the ratio of the etch rate of one material to the etch rate of another material. The term "selective etch" or "selectively etch" means to etch one material more than another material, or in other words to have a greater or less than 1:1 etch selectivity between two materials.

The term "independently" when used in the context of describing R groups should be understood to denote that the subject R group is not only independently selected relative to other R groups bearing the same or different subscripts or superscripts, but is also independently selected relative to any additional species of that same R group. For example, in the formula $MR^1_x(NR^2R^3)_{(4-x)}$, where M is an atom, x is 2 or 3, the two or three $R^1$ groups may, but need not be identical to each other or to $R^2$ or to $R^3$. Further, it should be understood that unless specifically stated otherwise, values of R groups are independent of each other when used in different formulas.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements may be referred to by these abbreviations (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

Please note that the silicon-containing films, such as silicon nitride and silicon oxide, are listed throughout the specification and claims without reference to their proper stoichoimetry. The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Preferably silicon oxide is $Si_nO_m$, where n ranges from 0.5 to 1.5 and m ranges from 1.5 to 3.5. More preferably, silicon oxide is $SiO_2$. Herein, SiO or silicon oxide in the following description represents $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants, such as B, C, P, As and/or Ge.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

FIG. 1a is a cross-sectional side view of exemplary layers in back end metallization before etch of the low k layer;

DESCRIPTION OF PREFERRED EMBODIMENTS

Figure 1B:
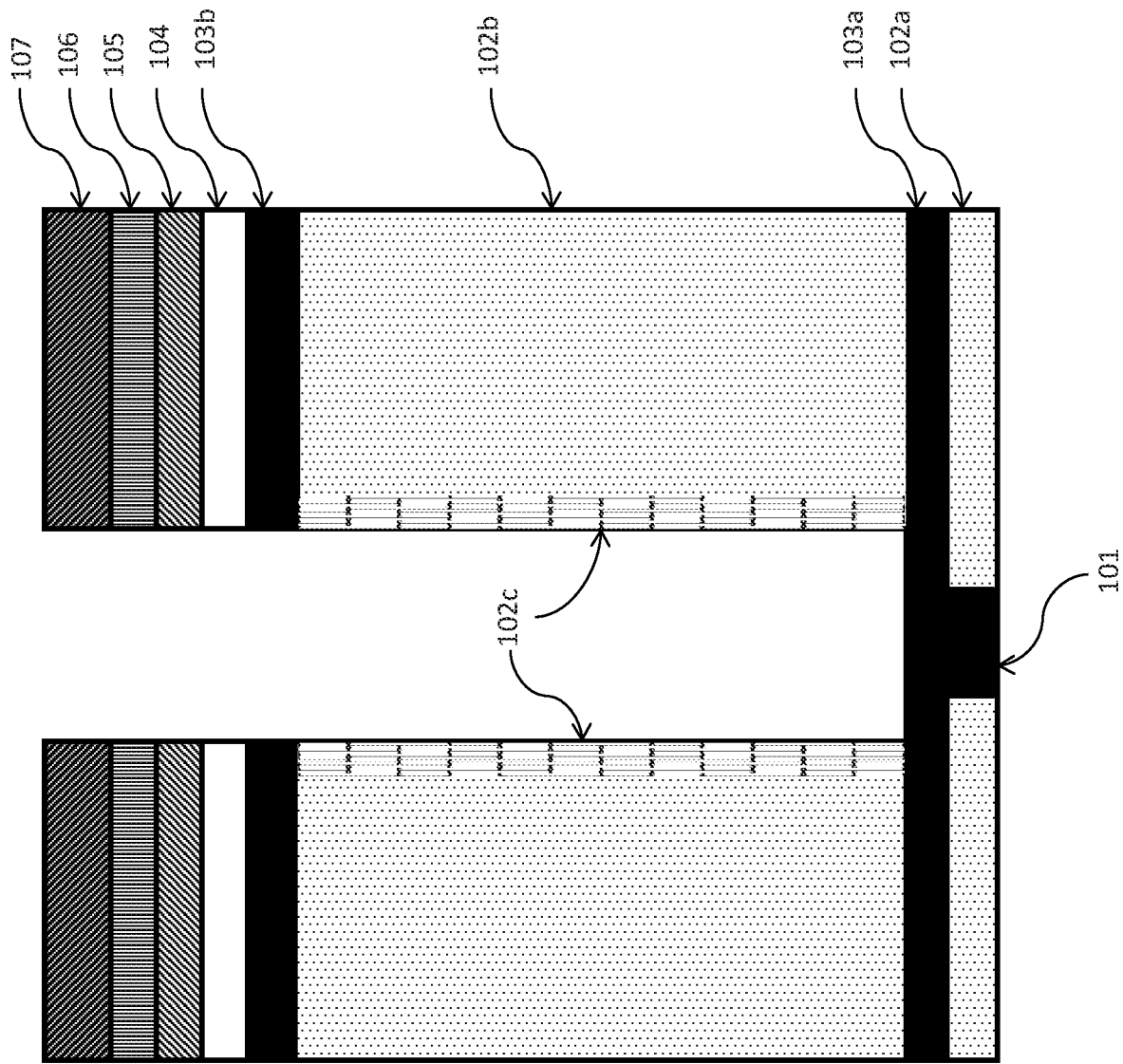
FIG. 1b is a cross-sectional side view of exemplary layers in back end metallization after etch of the low k layer.

Disclosed are methods for minimizing sidewall damage during low k etch processes. The low k etch process may be used for plasma etching low k films during back end metallization.

The disclosed methods include the steps of i) introducing a vapor of a nitrogen containing etching composition into a reaction chamber containing a silicon-containing film on a substrate, wherein the nitrogen containing etching composition is an organofluorine compound containing a C≡N, C═N, or C—N functional group; ii) optionally introducing an inert gas into the reaction chamber; and iii) activating a plasma to produce an activated nitrogen containing etching composition capable of etching the silicon-containing film from the substrate.

The disclosed organofluorine compounds comprising a C≡N functional group have the general formulae:

   (I)

   (II)

wherein R has the formula $H_aF_bC_c$ with a=0-11, b=1-11, and c=1-5. The $H_aF_bC_c$ functional group may be linear, branched, or cyclic. The $H_aF_bC_c$ functional group may be saturated or unsaturated. Applicants believe that the C≡N functionality may provide improved etch resistant polymer deposition benefits compared to $C_xF_y$ polymers, wherein x ranges from 0.01 to 1 and y ranges from 0.01 to 4. As shown in Example 6, the C≡N functional group may provide less nitrogen in any resulting polymer passivation layer than provided by the C—N functional group, which may be desirable in smaller structures. When the organofluorine compound includes at least one H (i.e., R has the formula $H_aF_bC_c$ with a=1-11, b=1-11, and c=1-5), the etch rate of SiN may be enhanced while maintaining high selectivity to the mask layer.

Exemplary organofluorine compounds comprising a C≡N functional group include trifluoroacetonitrile ($C_2F_3N$), nonafluoropentanitrile ($C_5F_9N$), pentafluoroallyl cyanide ($C_4F_5N$), difluoroacetonitrile ($C_2HF_2N$), 2,3,3,3-tetrafluoropropionitrile ($C_3HF_4N$), 2,2,3,3-tetrafluoropropionitrile, 4,4,4-Trifluorocrotononitrile, 3,3,3-Trifluoropropionitrile, fluoroacetonitrile, octafluorohexane-1,6-dinitrile, 1,1-bis(trifluoromethyl)-2,2-dicyanoethylene, or 2-[1-(difluoromethyl)-2,2,2-trifluoroethylidene]-propanedinitrile. Preferably, the organofluorine compound is 2,3,3,3-tetrafluoropropionitrile ($C_3HF_4N$) or difluoroacetonitrile ($C_2HF_2N$).

The disclosed organofluorine compounds comprising a C═N functional group have the general formula:

   (III)

wherein x=1-2, y=1-2, z=0-1, x+z=1-3, and each R independently has the formula $H_aF_bC_c$ with a=0-11, b=1-11, and c=0-5. The $H_aF_bC_c$ functional group may be linear, branched, or cyclic. The $H_aF_bC_c$ functional group may be saturated or unsaturated. Applicants believe that the C═N functionality may provide improved selectivity among silicon layers compared to $C_xF_y$ polymers, wherein x ranges from 0.01 to 1 and y ranges from 0.01 to 4. When the organofluorine compound includes at least one H (i.e., at least one R has the formula $H_aF_bC_c$ with a=1-11, b=1-11, and c=0-5, and preferably when at least one $R_x$ is H), the etch rate of SiN may be enhanced while maintaining high selectivity to the mask layer.

Exemplary organofluorine compounds comprising the C═N functional group include N,1,1,1,3,3,3-heptafluoropropanamine, hexafluoroacetone imine ($C_3HF_6N$), or 1,1,1,6,6,6-Hexafluoro-3-azahex-3-ene.

The disclosed organofluorine compounds comprising a C—N functional group have the general formula:

   (IV)

wherein a=1-2 and each R independently has the formula $H_aF_bC_c$ with a=0-11, b=1-11, and c=0-5. The $H_aF_bC_c$ functional group may be linear, branched, or cyclic. The $H_aF_bC_c$ functional group may be saturated or unsaturated. Applicants believe that the C—N functionality may provide improved selectivity among silicon layers compared to $C_xF_y$ polymers, wherein x ranges from 0.01 to 1 and y ranges from 0.01 to 4. As shown in Example 6, the C—N functional group may provide more nitrogen in any resulting polymer passivation layer than provided by the C═N functional group. When the organofluorine compound includes at least one H (i.e., when at least one R has the formula $H_aF_bC_c$ with a=1-11, b=1-11, and c=1-5), the etch rate of SiN may be enhanced while maintaining high selectivity to the mask layer.

Exemplary organofluorine compounds comprising the C—N functional group include 2,2,2-trifluoroethylamine ($C_2H_4F_3N$), 2,2,3,3,3-pentafluoropropylamine ($C_3H_4F_5N$), 2,2,3,3,4,4,4-heptafluorobutylamine ($C_4H_4F_7N$), 1,1,1,3,3,3-hexafluoroisopropylamine ($C_3H_3F_6N$), or bis(2,2,2-trifluoroethyl)amine ($C_4HsF_6N$).

Exemplary organofluorine compounds are listed in Table 2. These compounds are commercially available and their structure formula, CAS numbers, and boiling points are also included in Table 2.

TABLE 2

| Etching compounds | Formula | Structure | CAS # | Boiling point (° C.) |
|---|---|---|---|---|
| Trifluoroacetonitrile | $C_2F_3N$ | | 353-85-5 | −64 |
| Nonafluoropentanitrile | $C_5F_9N$ | | 22325-71-9 | 15 |
| Pentafluoroallyl cyanide | $C_4F_5N$ | | 7792-66-7 | 46-48 |
| difluoroacetonitrile | $C_2HF_2N$ | | 359-12-6 | 23 |
| 2,3,3,3-tetrafluoropropionitrile | $C_3HF_4N$ | | 431-32-3 | 40 |
| 2,2,3,3-tetrafluoropropionitrile | $C_3HF_4N$ | | 425-85-4 | 27 |
| Hexafluoroacetone imine | $C_3HF_6N$ | | 1645-75-6 | 16.5 |
| 4,4,4-Trifluorocrotononitrile | $C_4H_2F_3N$ | | 406-86-0 | 84-85 |
| 3,3,3-Trifluoropropionitrile | $C_3H_2F_3N$ | | 20530-38-5 | 92 |
| fluoroacetonitrile | $C_2H_2FN$ | | 503-20-8 | 79-80 |

TABLE 2-continued

Exemplary etching compounds

| Etching compounds | Formula | Structure | CAS # | Boiling point (° C.) |
|---|---|---|---|---|
| octafluorohexane-1,6-dinitrile | $C_6F_8N_2$ | | 376-53-4 | 63-64 |
| 1,1-bis(trifluoromethyl)-2,2-dicyanoethylene | $C_6F_6N_2$ | | 1113-69-5 | 226.2 |
| 1-trifluoromethyl,1-difluoromethyl,-2,2-dicyanoethylene | $C_6HF_5N_2$ | | 439913-54-9 | 255.9 |
| N,1,1,1,3,3,3-heptafluoro-propanamine | $C_3F_7N$ | | 2802-70-2 | −25 |
| Hexafluoroacetone imine | $C_3HF_6N$ | | 1645-75-6 | 16.5 |
| 1,1,1,6,6,6-Hexafluoro-3-azahex-3-ene | $C_5H_5F_6N$ | | 885275-84-3 | 87 |
| 2,2,2-trifluoroethylamine | $C_2H_4F_3N$ | | 753-90-2 | 36-37 |
| 2,2,3,3,3-penta-fluoropropylamine | $C_3H_4F_5N$ | | 422-03-7 | 49 |
| 2,2,3,3,4,4,4-hepta-fluorobutylamine | $C_4H_4F_7N$ | | 374-99-2 | 70-71 |

TABLE 2-continued

Exemplary etching compounds

| Etching compounds | Formula | Structure | CAS # | Boiling point (° C.) |
|---|---|---|---|---|
| 1,1,1,3,3,3-hexa-fluoroisopropyl-amine | $C_3H_3F_6N$ | (structure) | 1619-92-7 | 57-58 |
| Bis(2,2,2-trifluoroethyl)amine | $C_4H_5F_6N$ | (structure) | 407-01-2 | 70-71 |

The disclosed nitrogen-containing etching compositions may provide high selectivity to mask layers, etch stop layers and device channel materials and no profile distortion in high aspect ratio structures, such as those having an aspect ratio ranging from 10:1 to 200:1 such as DRAM and 3D NAND applications. Alternatively, the disclosed nitrogen-containing etching compositions may also provide high selectivity to mask layers or silicon nitride, such as those having an aspect ratio ranging from 1:1 to 50:1 in contact etch applications.

The disclosed nitrogen-containing etching compositions may provide infinite selectivity for wide process conditions of etching. Herein the selectivity refers to the etching rate ratio of two different layers. For example, the selectivity for SiO layer vs. an amorphous carbon (a-C) layer is the etch rate of the SiO divided by the etching rate of the a-C layer. The disclosed nitrogen-containing etching compositions may provide improved selectivity between the silicon-containing films and mask materials, less damage to channel region, and reduced bowing in pattern high aspect ratio structures. The disclosed nitrogen-containing etching compositions may also etch through alternating layers of p-Si, SiO, and/or SiN, resulting in a vertical etch profile (i.e., demonstrating selectivity ranging from 2:1 to 1:2 between the alternating layers).

The disclosed nitrogen-containing etching compositions may comprise greater than 95% v/v of the organofluorine compound, preferably greater than 99.99% v/v purity, and more preferably greater than 99.999% v/v purity. The disclosed nitrogen-containing etching compositions contain less than 5% by volume trace gas impurities, with less than 150 ppm by volume of impurity gases, such as $N_2$ and/or $H_2O$ and/or $CO_2$, contained in said trace gaseous impurities. Preferably, the water content in the plasma etching gas is less than 20 ppmw by weight. The purified product may be produced by distillation and/or passing the gas or liquid through a suitable adsorbent, such as a 4 A molecular sieve.

The disclosed nitrogen-containing etching compositions contain less than 10% v/v, preferably less than 1% v/v, more preferably less than 0.1% v/v, and even more preferably less than 0.01% v/v of any of the isomers of the organofluorine compound, which may be purified by distillation of the gas or liquid to remove isomers and may provide better process repeatability.

Alternatively, the disclosed nitrogen-containing etching compositions may contain between 5% v/v and 50% v/v of isomers of the organofluorine compound, particularly when the isomer mixture provides improved process parameters or if isolation of the target isomer is too difficult or expensive. For example, the disclosed nitrogen-containing etching compositions may comprise between approximately 50% v/v and approximately 75% v/v 2,3,3,3-tetrafluoropropionitrile and between approximately 25% v/v and approximately 50% v/v 2,2,3,3-tetrafluoropropionitrile. The mixture of isomers may reduce the need for two or more gas lines to the reaction chamber.

Some of the disclosed nitrogen-containing etching compositions are gaseous at room temperature and atmospheric pressure. For the non-gaseous (i.e., liquid or solid) compositions, their gas form may be produced by vaporizing the compositions through a conventional vaporization step, such as direct vaporization or by bubbling with inert gas ($N_2$, Ar, He). The non-gaseous compositions may be fed in liquid state to a vaporizer (direct liquid injection or "DLI") where it is vaporized before it is introduced into a reactor.

The disclosed nitrogen-containing etching compositions are suitable for plasma etching semiconductor structures, such as, channel holes, gate trenches, staircase contacts, capacitor holes, contact holes, etc., in the silicon-containing films. The disclosed nitrogen-containing etching compositions are not only compatible with currently available mask materials but also compatible with the future generations of mask materials because the disclosed nitrogen-containing etching compositions induce little to no damage on the mask along with good profile of high aspect ratio structures. In other words, the disclosed nitrogen-containing etching compositions may produce vertical etched patterns having minimal to no bowing, pattern collapse, or roughness. In order to achieve these properties, the disclosed nitrogen-containing etching compositions may deposit an etch-resistant polymer layer during etching to help reduce the direct impact of the oxygen and fluorine radicals during the etching process. The disclosed nitrogen-containing etching compositions may also reduce damage to p-Si or crystalline Si channel structure during etching. Preferably, the disclosed nitrogen-containing etching compositions are suitably volatile and stable during the etching process for delivery into the reactor/chamber.

Material compatibility tests are important to determine if any of the disclosed nitrogen-containing etching compositions will react with chamber materials and degrade the performance of the chamber with short term or long term use. Key materials involved in parts of the chamber, valves, etc. include stainless steel, aluminum, nickel, PCTFE, PVDF, PTFE and other metals and polymers. At times these materials are exposed to high temperatures, for example, higher than 20° C., and high pressures, for example, higher than 1 atm, which may enhance their degradation. The metrology methods may include visual inspection, weight measurement, measuring nanometer scale changes in scanning electron microscopy (SEM), tensile strength, hardness, etc.

The disclosed nitrogen-containing etching compositions may be used to plasma etch silicon-containing films on a substrate. The disclosed plasma etching method may be useful in the manufacture of semiconductor devices such as NAND or 3D NAND gates or Flash or DRAM memory or transistors such as fin-shaped field-effect transistor (FinFET), Bulk complementary metal-oxide-semiconductor (Bulk CMOS), fully depleted silicon-on-insulator (FD-SOI) structures. The disclosed nitrogen-containing etching compositions may be used in other areas of applications, such as different front end of the line (FEOL) and back end of the line (BEOL) etch applications. Preferably, due to the minimal sidewall damage incurred during the low k etch process, the disclosed nitrogen-containing etching compositions are used for etching Si in 3D through silicon via (TSV) etch applications for interconnecting memory to logic on a substrate.

The plasma etching method includes providing a reaction chamber having a substrate disposed therein. The reaction chamber may be any enclosure or chamber within a device in which etching methods take place such as, and without limitation, reactive ion etching (RIE), capacitively coupled plasma (CCP) with single or multiple frequency RF sources, inductively coupled plasma (ICP), or microwave plasma reactors, or other types of etching systems capable of selectively removing a portion of the silicon-containing film or generating active species. One of ordinary skill in the art will recognize that the different plasma reaction chamber designs provide different electron temperature control. Suitable commercially available plasma reaction chambers include but are not limited to the Applied Materials magnetically enhanced reactive ion etcher sold under the trademark eMAX™ or the Lam Research Dual CCP reactive ion etcher dielectric etch product family sold under the trademark 2300® Flex™. The RF power in such may be pulsed to control plasma properties and thereby improving the etch performance (selectivity and damage) further.

Alternatively, the plasma-treated reactant may be produced outside of the reaction chamber. The MKS Instruments' ASTRONi® reactive gas generator may be used to treat the reactant prior to passage into the reaction chamber. Operated at 2.45 GHz, 7 kW plasma power, and a pressure ranging from approximately 0.5 Torr to approximately 10 Torr, the reactant $O_2$ may be decomposed into two O radicals. Preferably, the remote plasma may be generated with a power ranging from about 1 kW to about 10 kW, more preferably from about 2.5 kW to about 7.5 kW.

The reaction chamber may contain one or more than one substrate. For example, the reaction chamber may contain from 1 to 200 silicon wafers having from 25.4 mm to 450 mm diameters. The substrates may be any suitable substrates used in semiconductor, photovoltaic, flat panel or LCD-TFT device manufacturing. Examples of suitable substrates include wafers, such as silicon, silica, glass, or GaAs wafers. The wafer will have multiple films or layers on it from previous manufacturing steps, including silicon-containing films or layers. The layers may or may not be patterned. Examples of suitable layers include without limitation silicon (such as amorphous silicon, p-Si, crystalline silicon, any of which may further be p-doped or n-doped with B, C, P, As, and/or Ge), silica, silicon nitride, silicon oxide, silicon oxynitride, $Si_aO_bH_cC_dN_e$, (wherein a>0; b, c, d, e≥0), mask layer materials such as amorphous carbon, antireflective coatings, photoresist materials, tungsten, titanium nitride, tantalum nitride or combinations thereof, etch stop layer materials such as silicon nitride, polysilicon, crystalline silicon, silicon carbide, SiCN or combinations thereof, device channel materials such crystalline silicon, epitaxial silicon, doped silicon, $Si_aO_bH_cC_dN_e$, (wherein a>0; b, c, d, e≥0) or combinations thereof. The silicon oxide layer may form a dielectric material, such as an organic based or silicon oxide based low-k dielectric material (e.g., a porous SiCOH film). An exemplary low-k dielectric material is sold by Applied Materials under the trade name Black Diamond II or III. Additionally, layers comprising tungsten or noble metals (e.g. platinum, palladium, rhodium or gold) may be used. Furthermore, examples of the silicon-containing films may be $Si_aO_bH_cC_dN_e$, (wherein a>0; b, c, d, e≥0). Throughout the specification and claims, the wafer and any associated layers thereon are referred to as substrates.

The following are exemplary embodiments of the substrates on which the disclosed nitrogen-containing etching compositions may be applied to etch.

In one embodiment, a substrate 100 may include a stack of multiple layers as shown in FIG. 1a. FIG. 1a is a cross-sectional side view of exemplary layers 100 in back end metallization before etch of the low k layer. In FIG. 1a, a copper wire 101 is surrounded by a low k layer 102a. An etch stop 103a is located between the copper wire 101 and a second low k layer 102b. A second etch stop 103b is located between the second low k layer 102b and a hard mask 104. An organic planarized layer 105 is located on the hard mask 104. A bottom anti-reflective coating layer 106 is located on the organic planarized layer 105. A photoresist 107 is located on the bottom anti-reflective coating layer 106. The bottom anti-reflective coating 106, organic planarized 105, hard mask 104, and second etch stop 103b layers are all etched to expose the surface of the second low k layer 102b prior to the disclosed process. One of ordinary skill in the art will recognize that the exemplary layers in FIG. 1a are provided for exemplary purposes only and that the disclosed nitrogen-containing etching compositions may be used to etch other types of stacks of layers.

FIG. 1b is a cross-sectional side view of exemplary layers in back end metallization after etch of the second low k layer 102b. The low k etch process produces damage 102c on the sidewalls of the second low k layer 102b. More particularly, the low k etch process removes the methyl terminations of the low k layer, leaving either dangling bonds or hydroxyl groups (Si—OH). As a result, the film becomes more hydrophilic and can readily absorb moisture. The damage 102c is a plasma-induced damage caused by chemical reactions between the plasma species of the nitrogen containing etching compositions and the sidewall material. This in turn leads to an increase in the dielectric constant, the degree of which depends on the severity of the damaging process. The disclosed nitrogen containing etching compositions produce fragments during the plasma process that are suitable for both anisotropically etching the second low k layer 102b and depositing a N-containing polymer passivation layer (not shown) on sidewalls of the second low k layer 102b. As a result, as shown in the examples that follow, the disclosed nitrogen containing etching compositions produce less damage to the second low k layer 102b than prior art etching compounds.

One of ordinary skill in the art will recognize that the layers in FIGS. 1a and 1b are not drawn to scale.

The vapor of the disclosed nitrogen-containing etching compositions is introduced into the reaction chamber containing the substrate and silicon-containing films. The vapor may be introduced to the chamber at a flow rate ranging from approximately 0.1 sccm to approximately 1 slm. For example, for a 200 mm wafer size, the vapor may be introduced to the chamber at a flow rate ranging from approximately 5 sccm to approximately 50 sccm. Alternatively, for a 450 mm wafer size, the vapor may be introduced to the chamber at a flow rate ranging from approximately 25 sccm to approximately 250 sccm. One of ordinary skill in the art will recognize that the flow rate may vary from tool to tool.

The disclosed nitrogen-containing etching compositions may be supplied either in neat form or in a blend with an inert gas, such as $N_2$, Ar, He, Xe, etc., or solvent. The disclosed nitrogen-containing etching compositions may be present in varying concentrations in the blend. For liquid nitrogen-containing compositions, the vapor form of the nitrogen-containing etching compositions may be produced by vaporizing the neat or blended nitrogen-containing etching composition solution through a conventional vaporization step such as direct vaporization or by bubbling. The neat or blended nitrogen-containing etching compositions may be fed in liquid state to a vaporizer where it is vaporized before it is introduced into the reactor.

Alternatively, the neat or blended nitrogen-containing etching compositions may be vaporized by passing a carrier gas into a container containing the disclosed nitrogen-containing etching compositions or by bubbling the carrier gas into the disclosed nitrogen-containing compositions. The carrier gas may include, but is not limited to, Ar, He, $N_2$, and mixtures thereof. Bubbling with a carrier gas may also remove any dissolved oxygen present in the neat or blended nitrogen-containing etching compositions solution. The carrier gas and disclosed nitrogen-containing etching compositions are then introduced into the reactor as a vapor.

If necessary, the container containing the disclosed nitrogen-containing etching compositions may be heated to a temperature that permits the nitrogen-containing etching compositions to be in liquid phase and to have a sufficient vapor pressure for delivery into an etching tool. The container may be maintained at temperatures in the range of, for example, approximately 0° C. to approximately 150° C., preferably from approximately 25° C. to approximately 100° C., more preferably from approximately 25° C. to approximately 50° C. More preferably, the container is maintained at room temperature (approximately 25° C.) in order to avoid heating lines to the etch tool. Those skilled in the art recognize that the temperature of the container may be adjusted in a known manner to control the amount of nitrogen-containing composition vaporized.

Additionally, the nitrogen-containing etching compositions are delivered in purity ranging from 95% to 99.999% by volume and may be purified with known standard purification techniques for removal of CO, $CO_2$, $N_2$, $H_2O$, HF, $H_2S$, $SO_2$, halides, and other hydrocarbons or hydrohalocarbons.

An inert gas is also introduced into the reaction chamber in order to sustain the plasma. The inert gas may be He, Ar, Xe, Kr, $N_e$, $N_2$ or combinations thereof. The etching gas and the inert gas may be mixed prior to introduction to the chamber, with the inert gas comprising between approximately 0.01% v/v and approximately 99.9% v/v of the resulting mixture. Alternatively, the inert gas may be introduced to the chamber continuously while the etching gas is introduced to the chamber in pulses.

The vapor of the disclosed etching gas and inert gas are activated by plasma to produce an activated etching gas. The plasma decomposes the etching gas into radical form (i.e., the activated etching gas). The plasma may be generated by applying RF or DC power. The plasma may be generated with a RF power ranging from about 25 W to about 10,000 W. The plasma may be generated remotely or within the reactor itself. The plasma may be generated in dual CCP or ICP mode with RF applied at both electrodes. RF frequency of plasma may range from 200 KHz to 1 GHz. Different RF sources at different frequency may be coupled and applied at same electrode. Plasma RF pulsing may be further used to control molecule fragmentation and reaction at substrate. One of skill in the art will recognize methods and apparatus suitable for such plasma treatment.

A quadrupole mass spectrometer (QMS), optical emission spectrometer, FTIR, or other radical/ion measurement tools may measure the activated etching gas from the chamber exhaust to determine the types and numbers of species produced. If necessary, the flow rate of the etching gas and/or the inert gas may be adjusted to increase or decrease the number of radical species produced.

The disclosed etching gases may be mixed with other gases either prior to introduction into the reaction chamber or inside the reaction chamber. Preferably, the gases may be mixed prior to introduction to the chamber in order to provide a uniform concentration of the entering gas.

In another alternative, the vapor of the nitrogen-containing composition may be introduced into the chamber independently of the other gases such as when two or more of the gases react.

In another alternative, the etching gas and the inert gas are the only two gases that are used during the etching process.

Exemplary other gases include, without limitation, oxidizers such as $O_2$, $O_3$, CO, $CO_2$, COS, NO, $N_2O$, $NO_2$, $SO_2$, and combinations thereof. The disclosed etching gases and the oxidizer may be mixed together prior to introduction into the reaction chamber.

Alternatively, the oxidizer may be introduced continuously into the chamber and the etching gas introduced into the chamber in pulses. The oxidizer may comprise between approximately 0.01% v/v to approximately 99.99% v/v of the mixture introduced into the chamber (with 99.99% v/v representing introduction of almost pure oxidizer for the continuous introduction alternative).

Other exemplary gases with which the etching gas may be mixed include additional etching gases, such as $cC_4F_8$, $C_4F_8$, $C_4F_6$, $CF_4$, $CH_3F$, $CF_3H$, $CH_2F_2$, COS, $CS_2$, $CF_3I$, $C_2F_3I$, $C_2F_5I$, $SO_2$, trans-1,1,1,4,4,4-hexafluoro-2-butene (trans-$C_4H_2F_6$), cis-1,1,1,4,4,4-hexafluoro-2-butene (cis-$C_4H_2F_6$), hexafluoroisobutene ($C_4H_2F_6$), trans-1,1,2,2,3,4-hexafluorocyclobutane (trans-$C_4H_2F_6$), 1,1,2,2,3-pentafluorocyclobutane ($C_4H_3F_5$), 1,1,2,2-tetrafluorocyclobutane ($C_4H_4F_4$), or cis-1,1,2,2,3,4-hexafluorocyclobutane (cis-$C_4H_2F_6$).

The vapor of the etching gas and the additional gas may be mixed prior to introduction to the reaction chamber. The additional etching gas may comprise between approximately 0.01% v/v to approximately 99.99% v/v of the mixture introduced into the chamber.

In one non-limiting exemplary plasma etch process, the vapor of 2,3,3,3-Tetrafluoropropionitrile is introduced into a 200 mm Dual CCP plasma etch tool using a controlled gas flow device. The controlled gas flow device may be a mass flow controller or a bubbler design with inert gas flow to deliver the vapor of the desired molecule. In case of high boiling point molecules, a special low pressure drop mass flow controller from Brooks Automation (No. GF120XSD), MKS Instruments, etc., may be used. The pressure of the reaction chamber is set at approximately 30 mTorr. No gas source heating is necessary, as the vapor pressure of 2,3,3,3-Tetrafluoropropionitrile is approximately 498 Torr at room temperature. The distance between the two CCP electrodes is kept at 1.35 cm and the top electrode RF power is fixed at 750 W. The bottom electrode RF power is varied to analyze the performance of the molecule. The reaction chamber contains a substrate for back end metallization having layers similar to those shown in FIG. 1a. The second low k layer 102b is patterned by the plasma of the disclosed nitrogen containing etching compositions (e.g., 2,3,3,3-Tetrafluoropropionitrile), oxygen, and Argon. Argon is independently introduced into the chamber at a 250 sccm flow rate. 2,3,3,3-Tetrafluoropropionitrile is independently introduced into the chamber at 15 sccm. 02 is independently introduced into the chamber and varied from 0 sccm to 20 sccm to determine optimum etching conditions. An aperture having an aspect ratio ranging from approximately 1:1 to approximately 20:1 is produced, in which the copper lines may be formed. Any residual polymer and/or any residual reaction products and/or a portion of or the entire damaged low k layer 102c are removed from the substrate using Piranha ($H_2SO_4+H_2O_2+H_2O$), SC1 (1:1:100 $NH_4OH:H_2O_2:H_2O$), SC2 (1:1000 $HCl:H_2O$), or HF. The aperture should maintain its aspect ratio after cleaning.

In another non-limiting exemplary plasma etch process, difluoroacetonitrile is introduced into a 200 mm Dual CCP plasma etch tool using a controlled gas flow device. The controlled gas flow device may be a mass flow controller. In case of high boiling point molecules, a special low pressure drop mass flow controller from BrooksAutomation (No. GF120XSD), MKS Instruments, etc., may be used. The pressure of the reaction chamber is set at approximately 30 mTorr. No gas source heating is necessary, as the vapor pressure of difluoroacetonitrile is approximately 900 Torr at 20° C. The distance between the two CCP electrodes is kept at 1.35 cm and the top electrode RF power is fixed at 750 W. The bottom electrode RF power is varied to analyze the performance of difluoroacetonitrile. The reaction chamber contains a substrate for back end metallization having a thick low k dielectric layer thereon, similar to the second low k layer 102a shown in FIG. 1a. The low k dielectric layer has the formula $Si_wO_xC_yH_z$, wherein w ranges from 0.01 to 1, x range from 0.01 to 1, y ranges from 0.01 to 1, and z ranges from 0.01 to 1. The low k layer may comprise pores to help lower its dielectric constant. The low k layer has a dielectric constant ranging from approximately 2.0 to approximately 3.0. After the low k etch process the low k layer has an increased dielectric constant between 2.0 and 3.5. The low k layer has a Young's modulus ranging from approximately 0 to approximately 10 GPa after the low k etch process.

Prior to this exemplary plasma etch process, the bottom antireflective coating 107, organic planarized 106, hard mask 105, and second etch stop 103b layers are patterned by a fluorocarbon (e.g., $CF_4$) and/or oxygen-containing gas (e.g., $O_2$). One of ordinary skill in the art will recognize that the mask layer 106 may be amorphous carbon, titanium nitride, photoresist, or silicon nitride. Argon is independently introduced into the chamber at a 250 sccm flow rate. Difluoroacetonitrile is independently introduced into the chamber at 15 sccm. $O_2$ is independently introduced into the chamber at 0-20 sccm to determine optimum etching conditions. An aperture having an aspect ratio ranging from approximately 1:1 to approximately 20:1 is produced, in which the copper lines may be formed.

The low k layers and the activated etching gas react to form volatile by-products that are removed from the reaction chamber. The a-C mask, antireflective coating, and photoresist layer are less reactive with the activated etching gas. Thus, the activated etching gas selectively reacts with the low k layers to form volatile by-products. Any residual polymer and/or any residual reaction products and/or a portion of or the entire damaged low k layer 102c are cleaned or removed from the substrate using Piranha ($H_2SO_4+H_2O_2+H_2O$), SC1 (1:1:100 $NH_4OH:H_2O_2:H_2O$), SC2 (1:1000 $HCl:H_2O$), or HF. The aperture should maintain its aspect ratio after cleaning, while simultaneously maintaining the low k dielectric constant and Young's modulus of the low k layer. The length or width of the aperture should remain within approximately 0 nm to approximately 11 nm of its original dimensions, preferably within approximately 0 nm to approximately 5 nm, and more preferably within approximately 0 nm to approximately 1 nm.

The temperature and the pressure within the reaction chamber are held at conditions suitable for the silicon-containing film to react with the activated etching gas. For instance, the pressure in the chamber may be held between approximately 0.1 mTorr and approximately 1000 Torr, preferably between approximately 1 mTorr and approximately 10 Torr, more preferably between approximately 10 mTorr and approximately 1 Torr, and more preferably between approximately 10 mTorr and approximately 100 mTorr, as required by the etching parameters. Likewise, the substrate temperature in the chamber may range between about approximately −196° C. to approximately 500° C., preferably between approximately −120° C. to approximately 300° C., more preferably between approximately −100° C. to approximately 50° C.; and more preferably between approximately −10° C. to approximately 40° C. Chamber wall temperatures may range from approximately −196° C. to approximately 300° C. depending on the process requirements.

The reactions between the low k layers and the activated etching gas result in anisotropic removal of a desired section of the low k layers from the substrate. Atoms of carbon may also be present in the low k layers. The removal is due to a physical sputtering of the low k layer from plasma ions (accelerated by the plasma) and/or by chemical reaction of plasma species to convert Si to volatile species, such as $SiF_x$, wherein x ranges from 1-4.

The plasma activated vapor of the disclosed nitrogen-containing etching compositions preferably exhibits high selectivity toward the mask and etches through the low k layer resulting in a vertical etch profile with no bowing or roughness. Additionally, the plasma activated vapor deposits polymer on sidewall to minimize feature profile deformation. For other applications, such as DRAM and 2D NAND, for example, the plasma activated etching gas under different process conditions may selectively etch SiO from SiN. The plasma activated etching gas may selectively etch SiO and/or SiN from mask layers, such as a-C, photoresist, p-Si, or silicon carbide; or from metal contact layers, such as Cu; or from channel regions consisting of SiGe or polysilicon regions.

The disclosed etch processes using the disclosed nitrogen-containing etching compositions as the etching gases produce channel holes, gate trenches, staircase contacts, capacitor holes, contact holes, etc., in the silicon-containing films. The resulting aperture may have an aspect ratio ranging from approximately 10:1 to approximately 200:1 and a diameter ranging from approximately 5 nm to approximately 50 nm. For example, one of ordinary skill in the art will recognize that a channel hole etch produces apertures in the silicon-containing films having an aspect ratio greater than 60:1.

Typical materials that need to be etched may be SiO. A process of etching SiO may be relevant to etching trenches in Borophosphosilicateglass (BPSG), Tetraethylorthosilicate (TEOS), or low deposition rate TEOS (LDTEOS). An etch stop layer may be silicon nitride or silicon oxygen nitride (SiON) or poly silicon. A mask material used may be a-C, p-Si, or photo resist materials. Herein, the disclosed nitrogen-containing etching compositions are applied to etch SiO, SiN, p-Si and/or a-C substrate films.

EXAMPLES

The following non-limiting examples are provided to further illustrate embodiments of the invention. However, the examples are not intended to be all inclusive and are not intended to limit the scope of the inventions described herein.

In the following examples, the etch performance of $C_2HF_2N$ (CAS No. 359-12-6), $C_3HF_4N$ (CAS No. 431-32-3), and $C_2H_4F_3N$ (CAS No. 753-90-2) nitrogen containing compositions are evaluated and compared against $CF_4$. The results show that $C_2HF_2N$, $C_3HF_4N$, and $C_2H_4F_3N$ nitrogen-containing etching compositions offer sidewall protection to maintain etch profile while preventing damage to the low k material and could be used for etching semiconductor structures, such as low k etch.

As will be shown, the results of the compounds $C_3HF_4N$ and $C_2HF_2N$ show greater promise because they meet all the required etching targets for low k etching applications.

Figure 2:
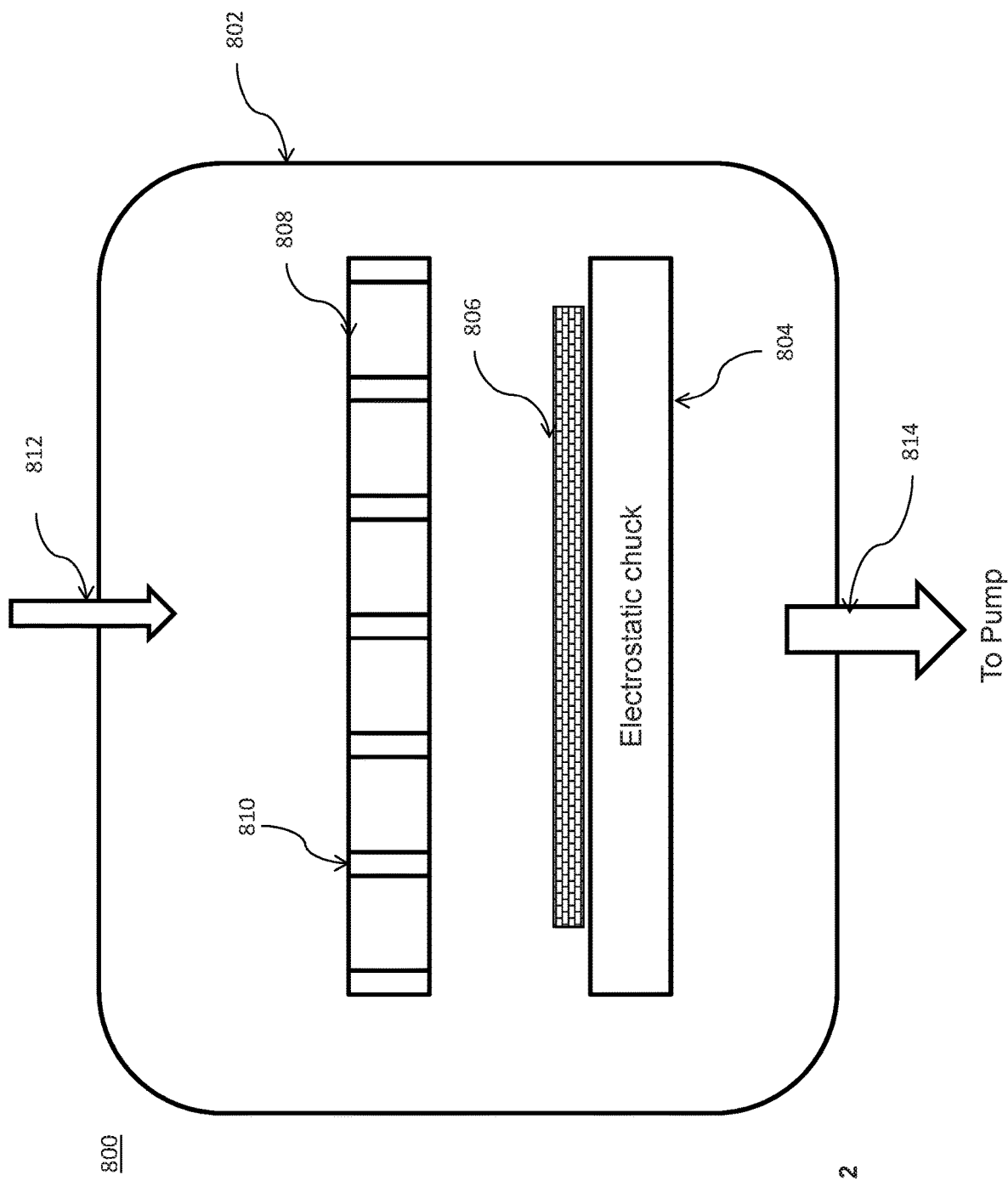
FIG. 2 is a cross-sectional side view of an exemplary reactor system utilized in the exemplary deposition and etching tests.

FIG. 2 is a cross-sectional side view of an exemplary reactor system applied in the following deposition and etching tests. As shown, the reactor 800 includes a reactor chamber 802. Inside the reactor chamber 802, a wafer 806 attached on the top of a bottom electrode 804 may be placed in the bottom portion of the reactor chamber 802, and a silicon top electrode showerhead 808 may be placed on the top portion of the reactor chamber 802. The bottom electrode 804 may be an electrostatic chuck having bias power applied thereto. For example, 2 MHz RF bias power may be applied to the bottom electrode 804. The wafer 806 may have multiple layers that need to be etched. The silicon top electrode showerhead 808 has a plurality of holes 810 in the showerhead through which the gases pass. The gases may be introduced into the reactor chamber 802 through gas inlet 812 and then pass through holes 810 in the showerhead 808 for uniform gas distribution. Source power may be applied to the silicon top electrode showerhead 808. For example, 27 MHz RF source power may be applied to the silicon top electrode showerhead 808. Between the silicon top electrode showerhead 808 and the bottom electrode 804 is the plasma region. The gases passing through the holes 810 in the showerhead 808 may be ionized in the plasma region and then perform etching on the wafer 806. The gases may be removed by pumping the gases out of the reactor chamber 802 from outlet 814.

Example 1

Etching experiments were performed on four 1×1 cm² coupons, each having 500 nm of low k silicon oxide (Black Diamond II), SiCN, SiN, or TiN. Etch rates are measured using an ellipsometer and/or scanning electron microscope (SEM) by measuring the change in etch thickness as a function of etching time. The coupons are placed on 200 mm diameter carrier wafer and held in contact by using double sided carbon tape obtained from 2 spi manufacturer. Alternatively, thermal paste could be used to stick coupons on carrier wafer. Reactor conditions were: RF power (200 W), bias power (200 W), chamber pressure (40 mTorr), Ar flow (250 sccm), etch gas flow (5 sccm), and amount of substrate etched (50% or approximately 250 nm). The temperature in the reactor was approximately room temperature (i.e., approximately 20° C. to approximately 25° C.).

Figure 3:
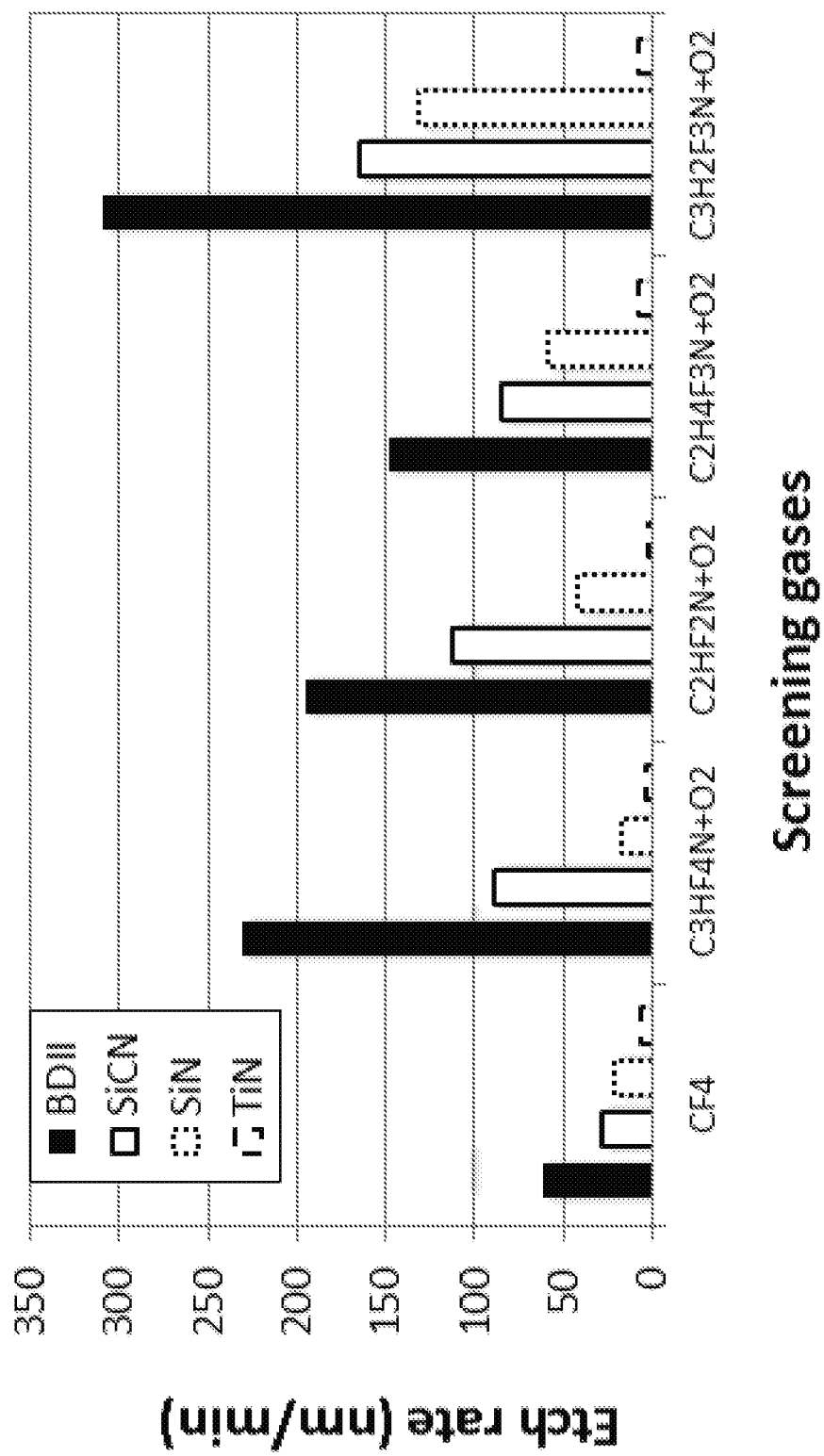
FIG. 3 is a graph demonstrating etch rates of low k, SiCN, SiN, and TiN by $CF_4$, $C_3HF_4N$ with $O_2$, $C_2HF_2N$ with $O_2$, or $C_2H_4F_3N$ with $O_2$.

FIG. 3 is a graph demonstrating etch rates of low k (Black Diamond II or BDII) (filled solid black bar), SiCN (hollow solid black bar), SiN (hollow dotted black bar), and TiN (hollow dashed black bar) by $CF_4$, $C_3HF_4N$ with $O_2$, $C_2HF_2N$ with $O_2$, $C_2H_4F_3N$ with $O_2$, or $C_3H_2F_3N$ with $O_2$. In FIG. 3, the y-axis represents etch rates in nm/min and the x-axis specifies the etch gas. No oxygen was needed for the $CF_4$ etch. The N of the N containing etch gases may produce polymer layers on the substrate, rather than etch it, without the use of oxygen and therefore oxygen was added to the etch process using these compounds. 10 sccm $O_2$ was used for the $C_3HF_4N$ etch; 14 sccm $O_2$ was used for the $C_2HF_2N$ etch; 3 sccm $O_2$ was used for the $C_2H_4F_3N$ etch, and 10 sccm was used for the $C_3H_2F_3N$ etch.

Figure 4:
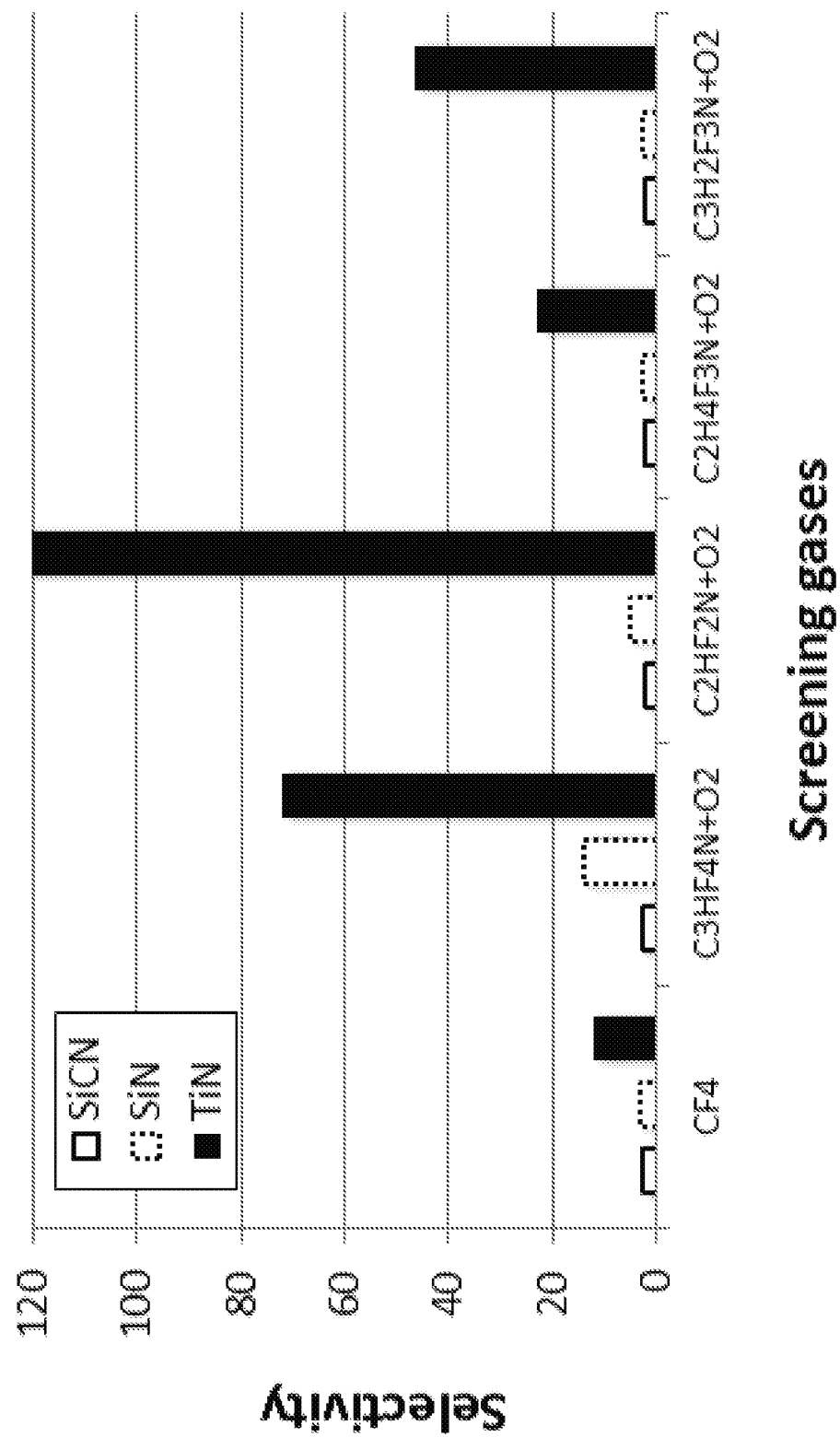
FIG. 4 is a graph demonstrating the low k selectivity of the specified etch gases to SiCN, SiN, and TiN.

FIG. 4 is a graph demonstrating the low k selectivity of the specified etch gas to SiCN (hollow solid bar), SiN (hollow dotted bar), and TiN (solid grey bar). In FIG. 4, the y-axis represents the selectivity (i.e., low k etch rate/divided by etch rate of other film) and the x-axis represents the compounds compared. FIG. 4 shows that $C_2HF_2N$ and $C_3HF_4N$ exhibit high selectivity (approximately 120 and approximately 70, respectively) of low k to TiN.

Example 2

A planar low k wafer was etched by differing etch gases. Etching experiments were performed on 500 nm of BDII on 1×1 cm² coupons. The coupons are placed on 200 mm diameter carrier wafer and held in contact by using double sided carbon tape obtained from 2 spi manufacturer. Alternatively, thermal paste could be used to stick coupons on carrier wafer. Reactor conditions were: RF power (200 W), bias power (200 W), chamber pressure (40 mTorr), Ar flow (250 sccm), etch gas flow (5 sccm), and amount of substrate etched (50% or approximately 250 nm).

Figure 5:
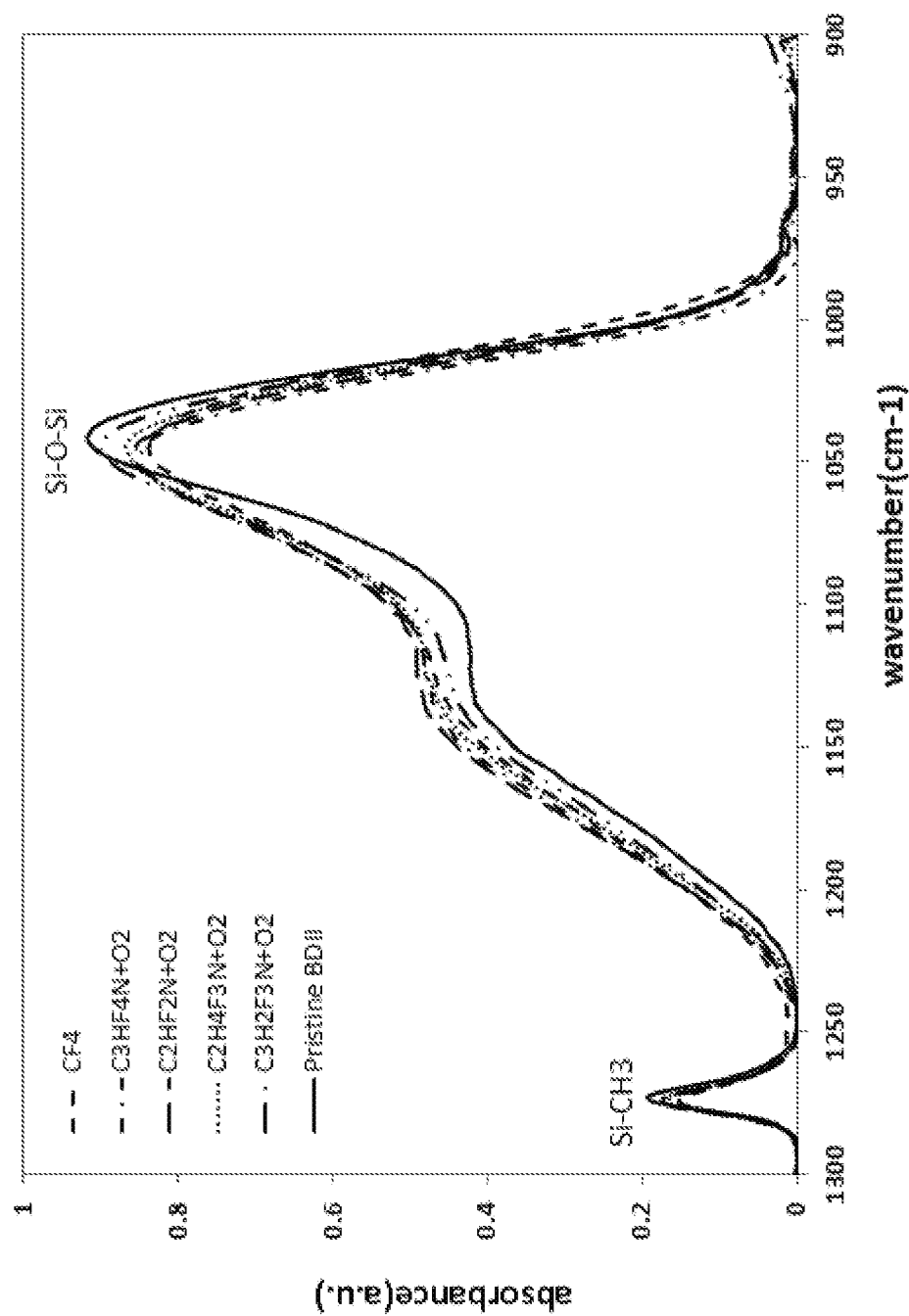
FIG. 5 is a graph showing the FTIR spectra of a low k layer at approximately 1300-900 $cm^{-1}$ before and after etching by the specified gases.
Figure 6:
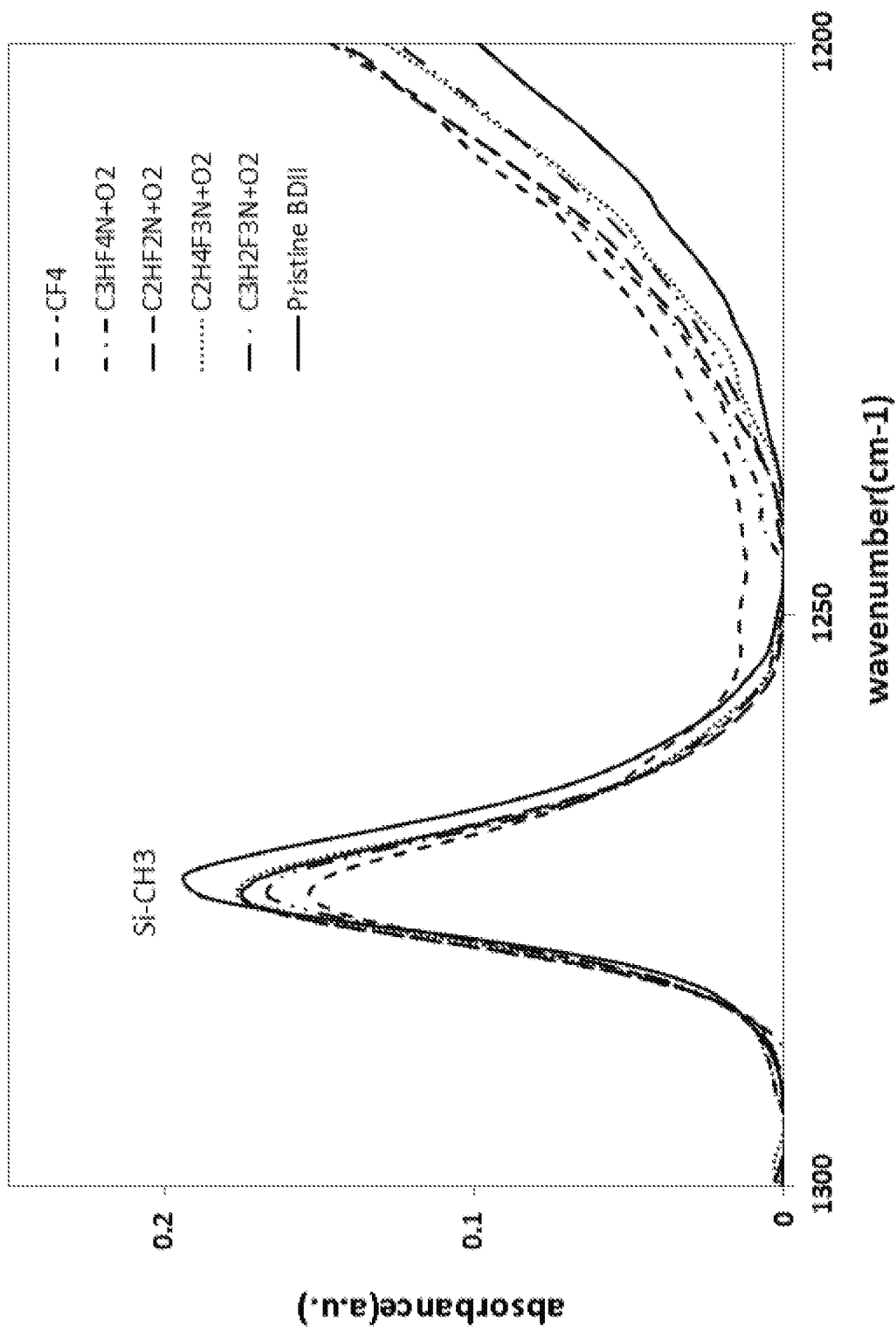
FIG. 6 is a graph focusing on the FTIR spectra of FIG. 5 at approximately 1270 cm-before and after etching by the specified gases.

The FTIR spectra of the low k wafer were taken before and after etching. FIG. 5 is a graph showing the FTIR spectra of the low k wafer at approximately 1300-900 cm⁻¹ before and after etching by the specified gases. The peak at approximately 1270 cm⁻¹ is for Si—CH₃ and the peak at approximately 1050 cm⁻¹ is for Si—O—Si. FIG. 6 is a graph focusing on the FTIR spectra of FIG. 5 at approximately 1270 cm⁻¹ before and after etching by the specified gases. The decrease in height of that peak from the before spectrum to the after spectra demonstrates that the Si—CH₃ bond is broken by plasma radicals during the etch process, causing damage to the low k film. The $CF_4$ etch results in the largest decrease in peak height.

The spectra of FIGS. 5 and 6 may be used to calculate the percentage of C lost during the etch process by normalizing the Si—O—Si peaks. More particularly, the percent reduction may be calculated by dividing (a) the Si—CH$_3$ peak intensity at 1270 cm$^{-1}$ divided by the Si—O—Si peak intensity at approximately 1050 cm$^{-1}$ for the etched film by (b) the Si—CH$_3$ peak intensity at 1270 cm$^{-1}$ divided by the Si—O—Si peak intensity at approximately 1050 cm$^{-1}$ for the unetched film and subtracting the results from 100% [i.e., C-loss %=100%-[(SiCH$_3$/SiOSi etched)/(SiCH$_3$/SiOSi unetched)]. The C-loss % results from Si—O—Si normalization of FIG. 5 are 14 (CF$_4$), 2 (C$_3$HF$_4$N), 3 (C$_2$HF$_2$N), 4 (C$_2$H$_4$F$_3$N) and 13 (C$_3$H$_2$F$_3$N). As a result, the disclosed N-containing etching compositions result in less C loss during the etching process than CF$_4$.

Alternatively, the spectra of FIGS. 5 and 6 may be used to calculate the percentage of C lost during the etch process by normalizing the residual film thickness. More particularly, the percent reduction may be calculated by (a) subtracting the difference between the etched Si—CH$_3$ peak intensity and the unetched Si—CH$_3$ peak intensity from 100 and (b) multiplying by the residual film thickness divided by 250 [i.e., C-loss %=[100%-(I1-I2)](T$_{film}$/250)]. The C-loss % results from residual film thickness normalization of FIG. 5 are 22 (CF$_4$), 10 (C$_3$HF$_4$N), 9 (C$_2$HF$_2$N), 9 (C$_2$H$_4$F$_3$N) and 25 (C$_3$H$_2$F$_3$N). See Table 3 below.

TABLE 3

Summary of C-loss % and damage layer thickness

| molecules | C-loss % normalized by Si-O-Si | C-loss % normalized by thickness | damage layer (nm) |
|---|---|---|---|
| CF$_4$ | 14 | 22 | 53 |
| C$_3$HF$_4$N + O$_2$ | 2 | 10 | 38 |
| C$_2$HF$_2$N + O$_2$ | 3 | 9 | 43 |
| C$_2$H$_4$F$_3$N + O$_2$ | 4 | 9 | 38 |
| C$_3$H$_2$F$_3$N + O$_2$ | 13 | 25 | 50 |

Example 3

Figure 7:
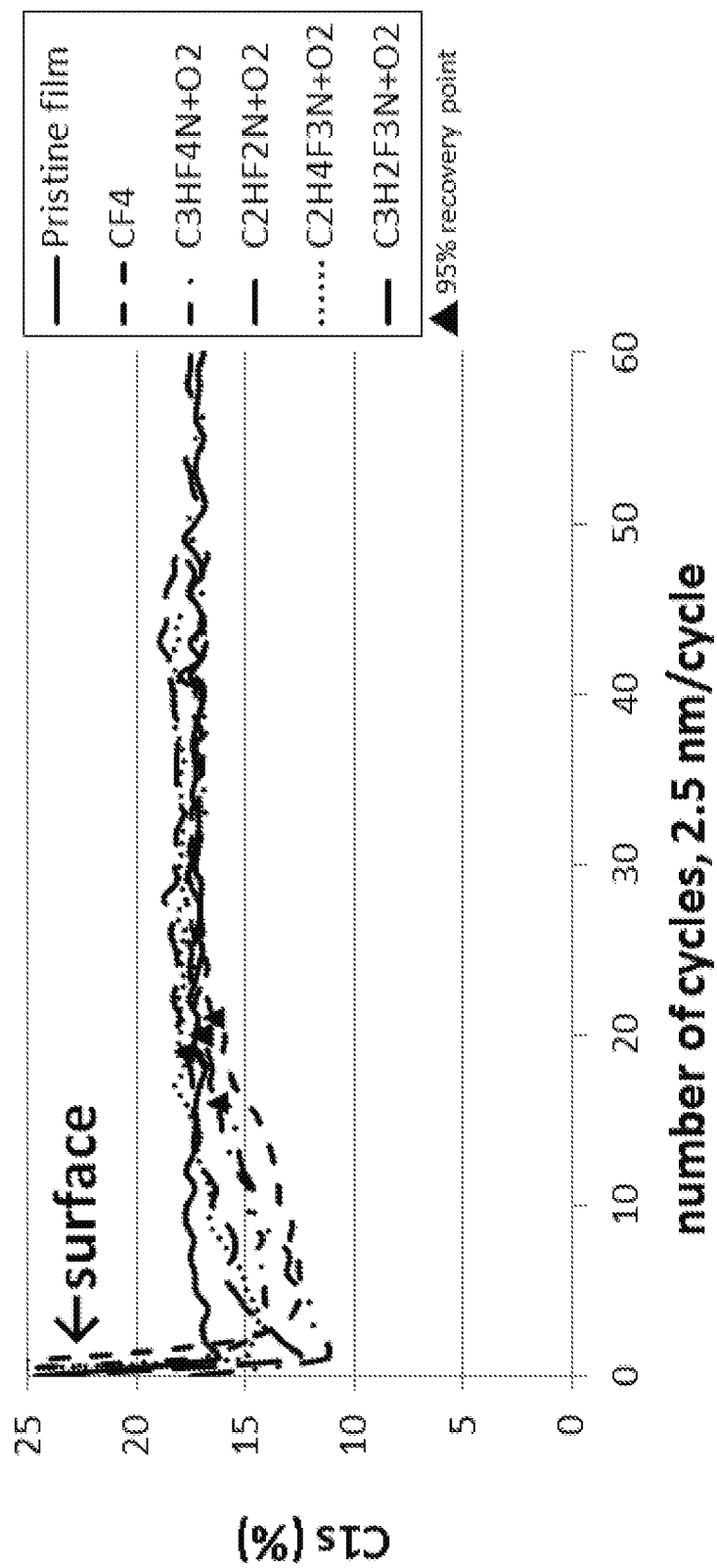
FIG. 7 is an X-ray Photoelectron Spectrometric (XPS) graph demonstrating the percent C1 before and after etching of a low k layer by the specified gases.

The same low k wafers from Example 2 were analyzed by X-ray Photoelectron Spectrometry (XPS). FIG. 7 is an XPS graph demonstrating the percent C1 before and after etching of a low k layer by the specified gases. The XPS analysis was performed by repeated ion sputtering of the low k layer at 2.5 nm/cycle. In FIG. 7, the y-axis represents the percentage of Carbon and the x-axis represents the number of ion sputtering cycles, at 2.5 nm/cycle.

The thickness of the damaged layer may be determined by determining the number of cycles until the carbon percentage returns to the same level as the carbon percentage in the pristine film. To avoid any effect from fluctuated noise, a 95% recovery point is chosen to determine the thickness. The thickness of the damage layer in nm of FIG. 7 are 53 (CF$_4$—which is approx. 21.2 cycles at 2.5 nm/cycle to return to a 95% carbon level), 38 (C$_3$HF$_4$N), 43 (C$_2$HF$_2$N), 38 (C$_2$H$_4$F$_3$N), and 50 (C$_3$H$_2$F$_3$N).

Example 4

Figure 8A:
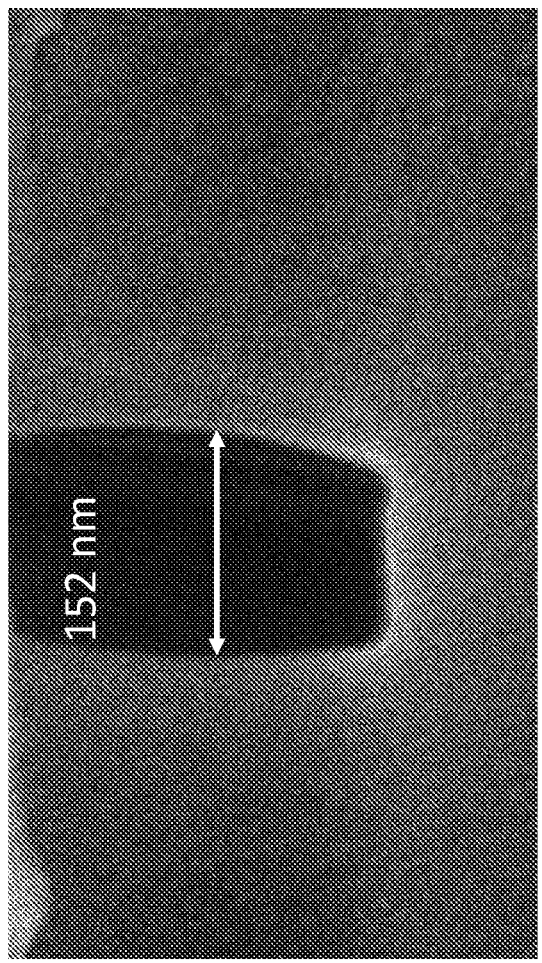
FIG. 8a is a scanning electron microscopic picture of the patterned wafer etched by $C_3HF_4N$ before HF dipping.
Figure 8B:
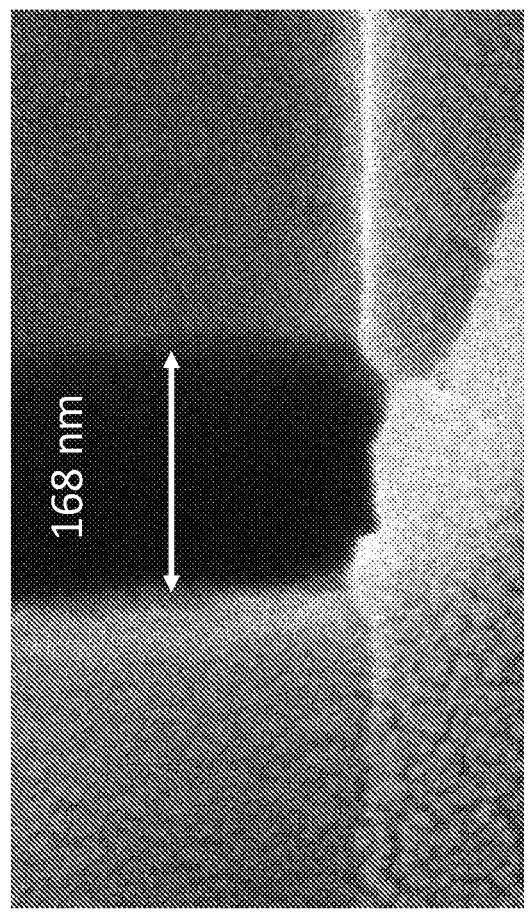
FIG. 8b is a scanning electron microscopic picture of the patterned wafer etched by $C_3HF_4N$ after HF dipping.

Etching experiments were performed on a patterned wafer having, from top down, a photoresist, bottom anti-reflective coating, silicon nitride etch stop, and low k layer on a Si substrate to determine sidewall damage of the low k layer. The reactor conditions for the low k etch were: RF power (200 W), bias power (200 W), chamber pressure (40 mTorr), Ar flow (250 sccm), and etch gas flow rate (5 sccm). The temperature in the reactor was approximately room temperature (i.e., approximately 20° C. to approximately 25° C.). 10 sccm O$_2$ was added to the C$_3$HF$_4$N etch gas and 14 sccm O$_2$ was added to the C$_2$HF$_2$N gas. The entire 300 nm low k layer was etched. Damage was measured using a SEM to measure the difference in the trench width before and after HF dipping divided by two [i.e., sidewall damage in nm= (pre HF width–post HF width)/2]. FIG. 8a is a scanning electron microscopic picture of the patterned wafer etched by C$_3$HF$_4$N before HF dipping. FIG. 8b is a scanning electron microscopic picture of the patterned wafer etched by C$_3$HF$_4$N after HF dipping. The averaged sidewall damage using C$_3$HF$_4$N was 9.3 nm±1.5 nm based upon three trench data points. The averaged sidewall damage using CF$_4$ was 13.8 nm±3.3 nm. The averaged sidewall damage using C$_2$HF$_2$N was 10.5 nm±0.5 nm.

Example 5

Etching experiments were performed on a patterned wafer having, from top down, a photoresist, bottom anti-reflective coating, silicon nitride etch stop, and low k layer on a Si substrate to determine sidewall damage of the low k layer at higher power conditions than in Example 4. The reactor conditions for the low k etch were: RF power (750 W), bias power (750 W), chamber pressure (40 mTorr), Ar flow (250 sccm), etch gas flow rate (5 sccm), and amount of substrate etched (50% or approximately 150 nm). The temperature in the reactor was approximately room temperature (i.e., approximately 20° C. to approximately 25° C.). 8 sccm O$_2$ was added to the C$_3$HF$_4$N etch gas. Damage was measured using a SEM to measure the difference in the trench width before and after HF dipping divided by two [i.e., sidewall damage in nm=(pre HF width–post HF width)/2]. The averaged sidewall damage using CF$_4$ was 23 nm. The averaged sidewall damage using C$_3$HF$_4$N was 13 nm. The averaged sidewall damage using CH$_2$F$_2$ was 24 nm.

Example 6

Deposition tests are performed on 1×1 cm$^2$ low k coupon at 30 mTorr, and source power of 750 W (27 MHz), with no bias power at the substrate. The process feed mixture contains 250 sccm of Ar and 5 sccm of etch gas. The deposition test sample is then sent for X-ray Photoelectron spectrometry (XPS) analysis to study the type of polymerizing film formed on the substrate.

Figure 9:
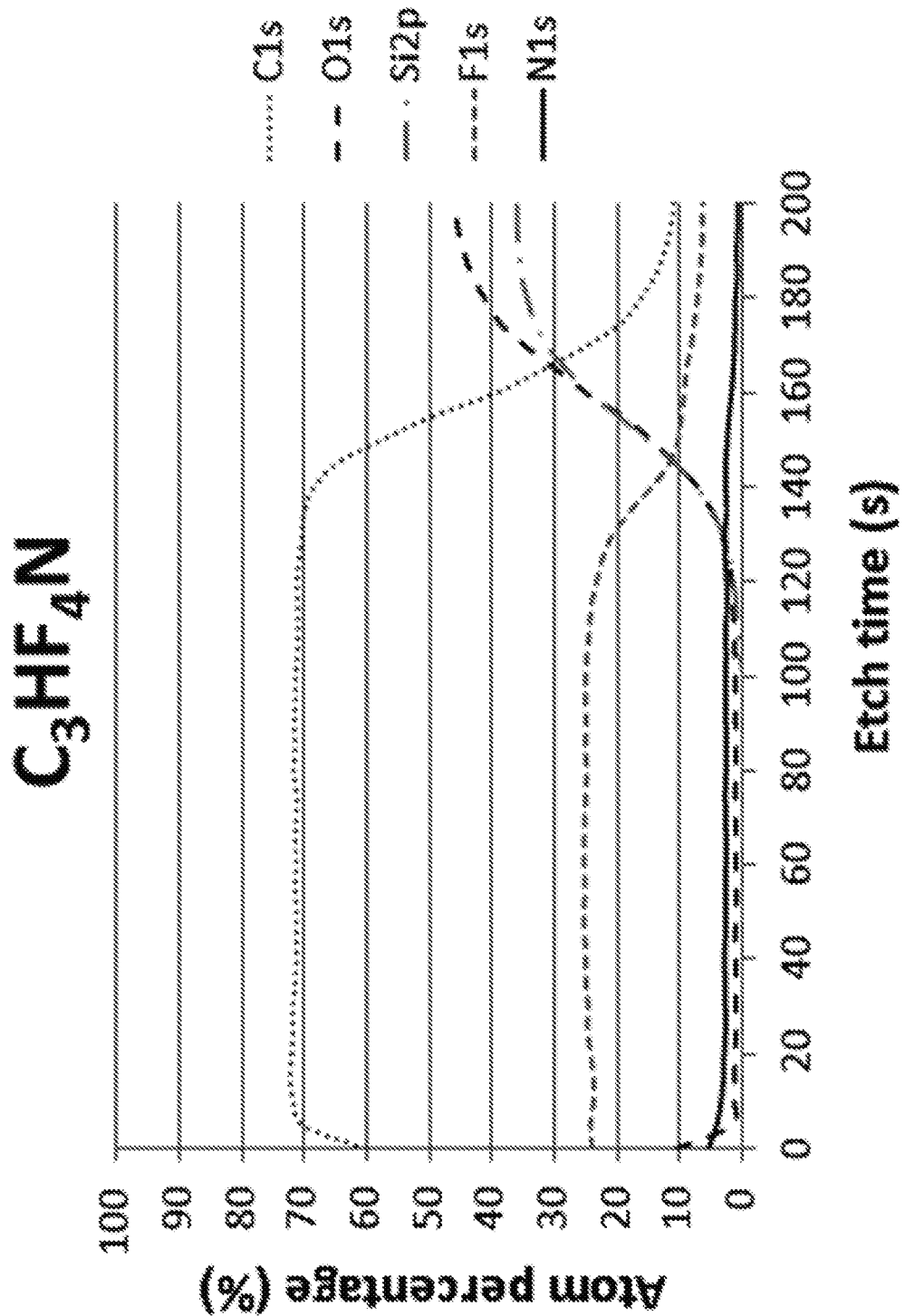
FIG. 9 is an XPS graph of a polymer film formed by plasma deposition using $C_3HF_4N$.

FIG. 9 is an XPS graph of a polymer film formed from C$_3$HF$_4$N. FIG. 9 clearly shows the presence of C, F, and N present in the polymer film. The nitrogen present in the polymer film may form polymers that act as a better sidewall passivation layer and help create vertical profiles during high aspect ratio etching.

Figure 10:
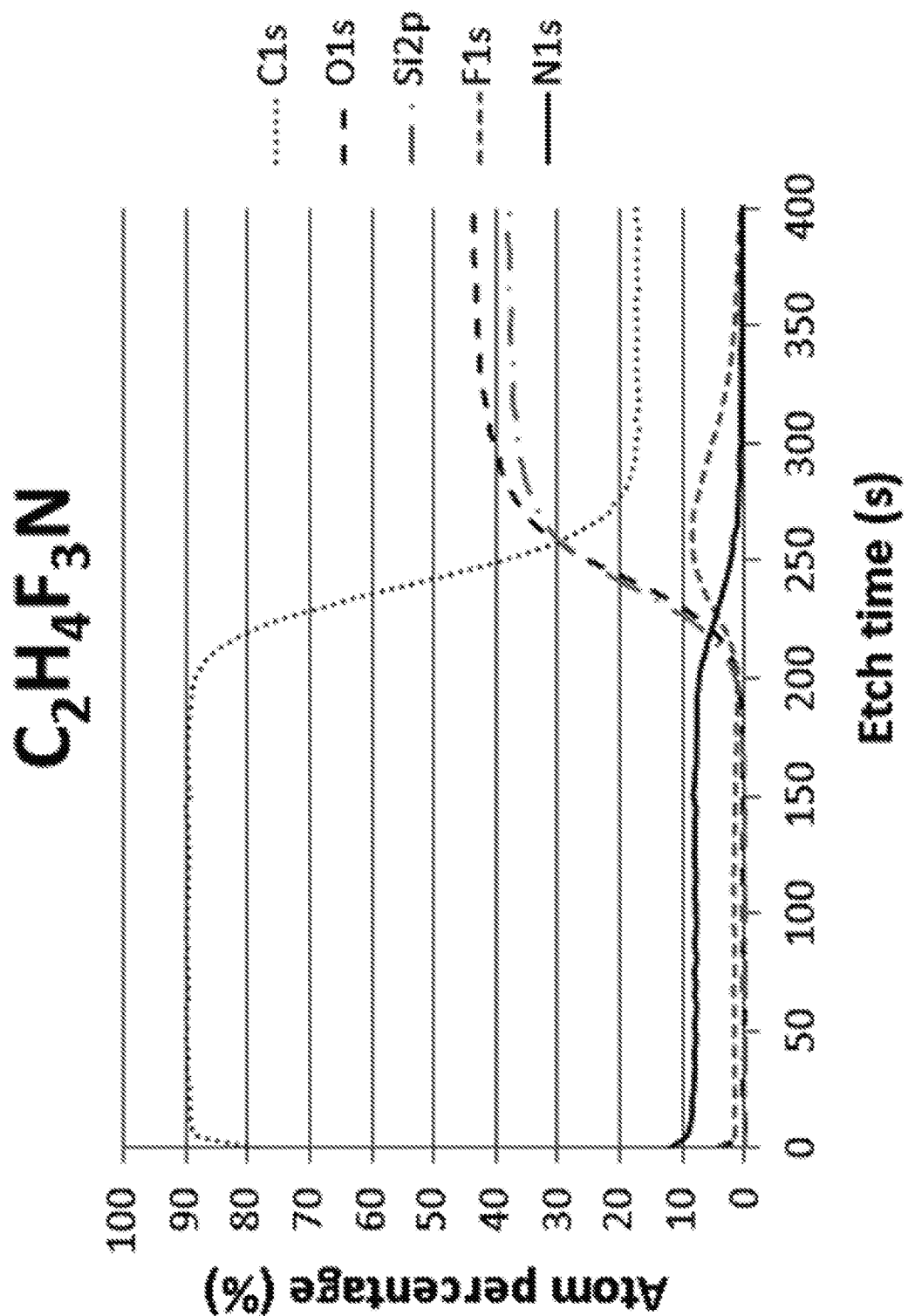
FIG. 10 is an XPS graph of a polymer film formed by plasma deposition using $C_2H_4F_3N$.

FIG. 10 is an XPS graph of a polymer film formed from C$_2$H$_4$F$_3$N. FIG. 10 clearly shows the presence of C, N, and F present in the polymer film. The nitrogen present in the polymer film may form polymers that act as a better sidewall passivation layer and help create vertical profiles during high aspect ratio etching.

The C—NH$_2$ structure of C$_2$H$_4$F$_3$N produces more N in the resulting polymer film than the C≡N structure of C$_3$HF$_4$N. Applicants believe that other C—NH$_2$ and C≡N molecules will behave similarly.

Comparative Example 1

Not all nitrogen containing compounds produce the desired etching results. As in Example 2, a planar low k wafer was etched by 2,2,2-trifluoroacetamidine ($C_2H_3F_3N_2$ CAS No. 354-37-0). Reactor conditions were: RF power (200 W), bias power (200 W), chamber pressure (40 mTorr), Ar flow (250 sccm), and etch gas flow rate (5 sccm). The temperature in the reactor was approximately room temperature (i.e., approximately 20° C. to approximately 25° C.). No low k layer thickness change was observed after 30 seconds of etching.

Figure 11:
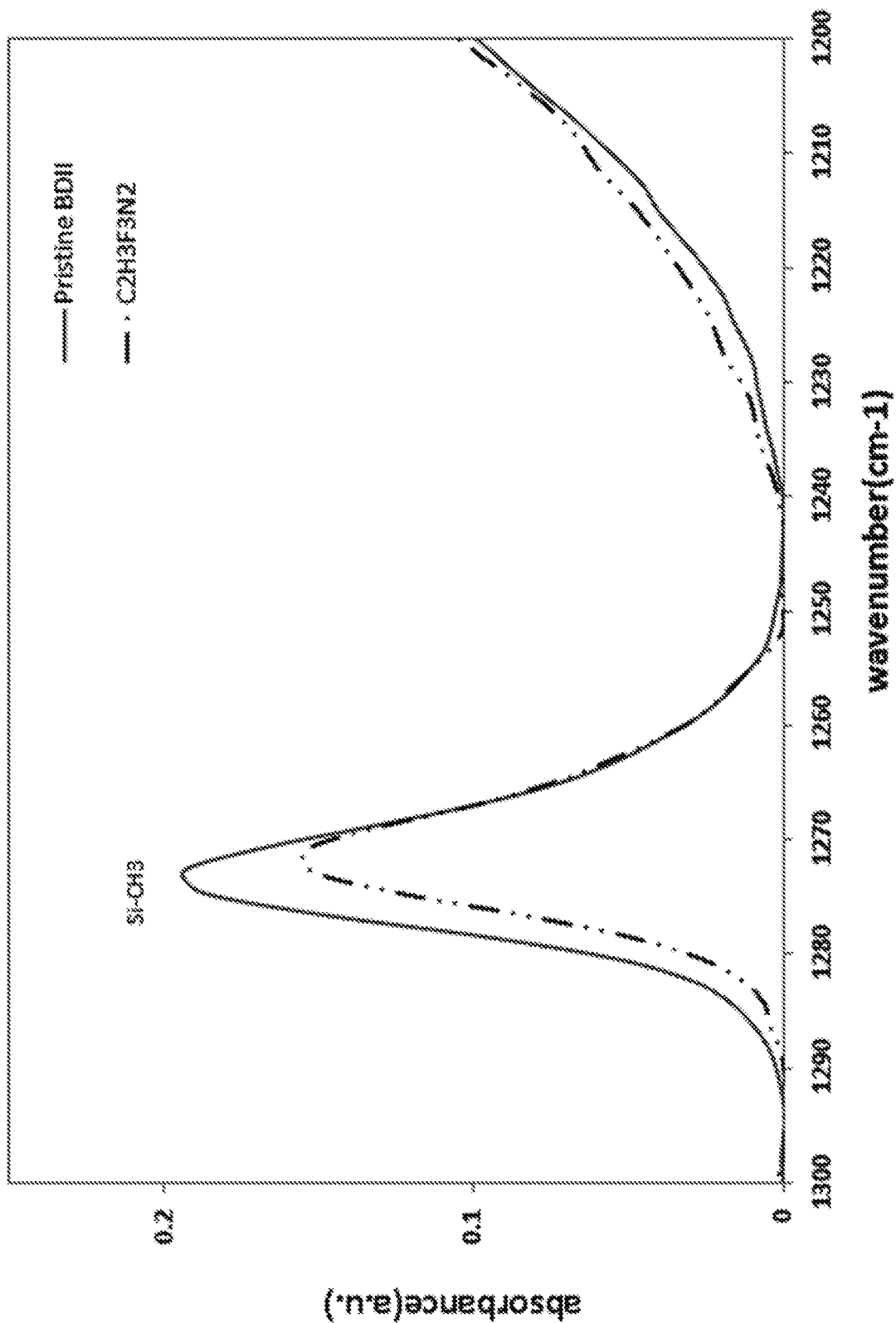
FIG. 11 is a graph showing the FTIR spectra of a low k layer at approximately 1300-1200 $cm^{-1}$ before and after etching by $C_2H_3F_3N_2$.

The FTIR spectra of the low k wafer was taken before and after etching. FIG. 11 is a graph showing the FTIR spectra at approximately 1300-1200 $cm^{-1}$ before and after etching by $C_2H_3F_3N_2$. The peak at approximately 1270 $cm^{-1}$ is for Si—$CH_3$. The decrease in height of that peak from the before spectrum to the after spectra demonstrates that the Si—$CH_3$ bond is broken by plasma radicals during the etch process, causing damage to the low k film. The $CF_4$ etch results in the largest decrease in peak height. The C-loss % result from Si—O—Si normalization of FIG. 11 is 19%. This is higher than that of $CF_4$ in Example 2, which was 14%.

Figure 12:
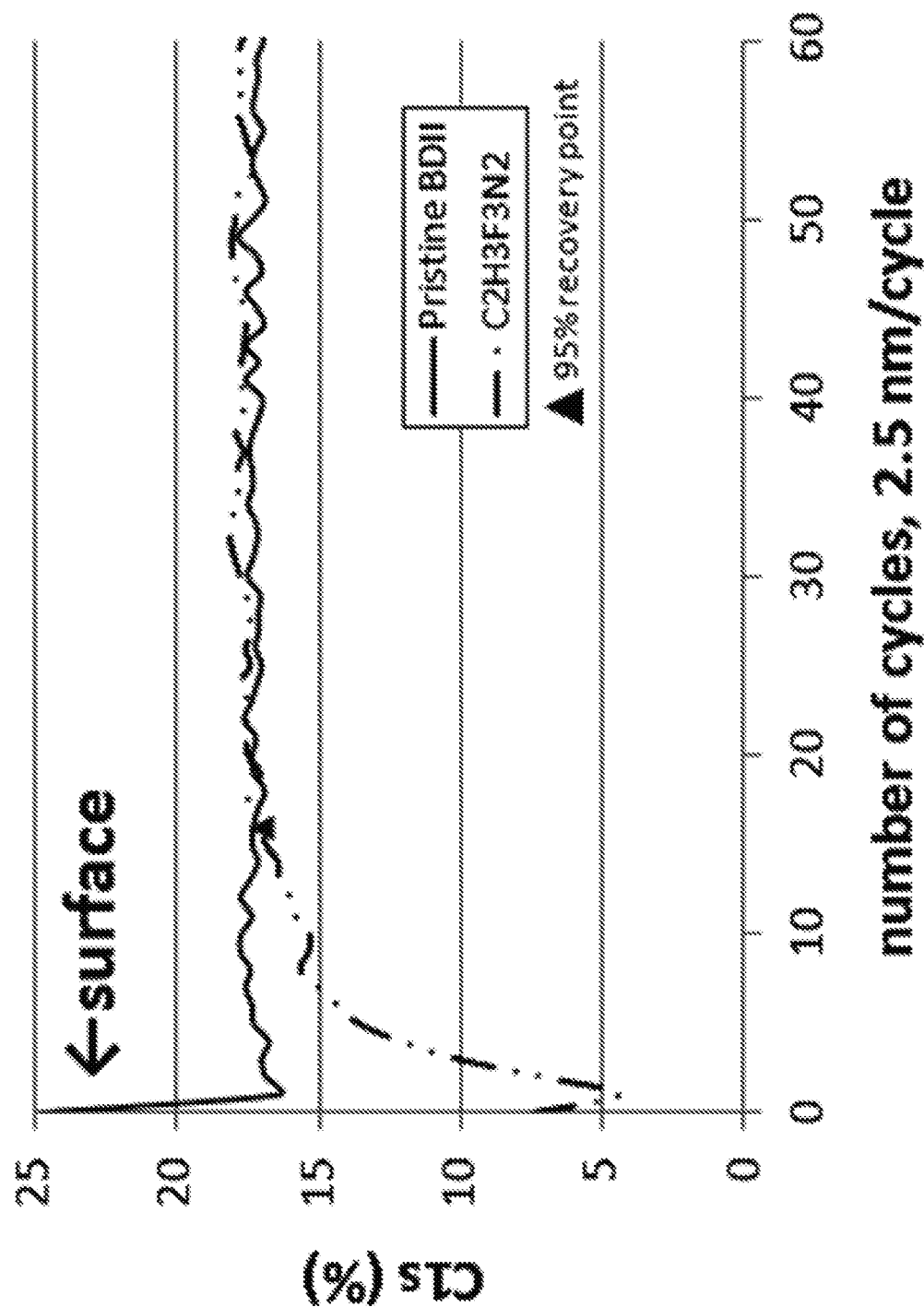
FIG. 12 is an XPS graph demonstrating the percent $C_1$ before and after etching of the low k layer by $C_2H_3F_3N_2$.

FIG. 12 is an XPS graph demonstrating the percent C1 before and after etching of the low k layer by $C_2H_3F_3N_2$. The XPS analysis was performed by repeated ion sputtering of the low k layer at 2.5 nm/cycle. In FIG. 12, the y-axis represents the percentage of Carbon and the x-axis represents the number of ion sputtering cycles. The thickness of the damage layer of FIG. 12 is 40 nm, which is smaller than Example 3's $CF_4$ (53 nm), while the carbon depletion at the top surface is large.

Comparative Example 2

Additionally, polymers that do not contain N do not behave the same as the disclosed nitrogen containing etching composition. $CH_2F_2$ (CAS No. 75-10-5) is a known polymer forming compound.

A planar low k wafer was etched by $CH_2F_2$. Etching experiments were performed on 500 nm of BDII on 1×1 $cm^2$ coupons. The coupons are placed on 200 mm diameter carrier wafer and held in contact by using double sided carbon tape obtained from 2 spi manufacturer. Alternatively, thermal paste could be used to stick coupons on carrier wafer. Reactor conditions were: RF power (750 W), bias power (750 W), chamber pressure (40 mTorr), Ar flow (250 sccm), etch gas flow (5-15 sccm), and $O_2$ flow (0-10 sccm).

Figure 13:
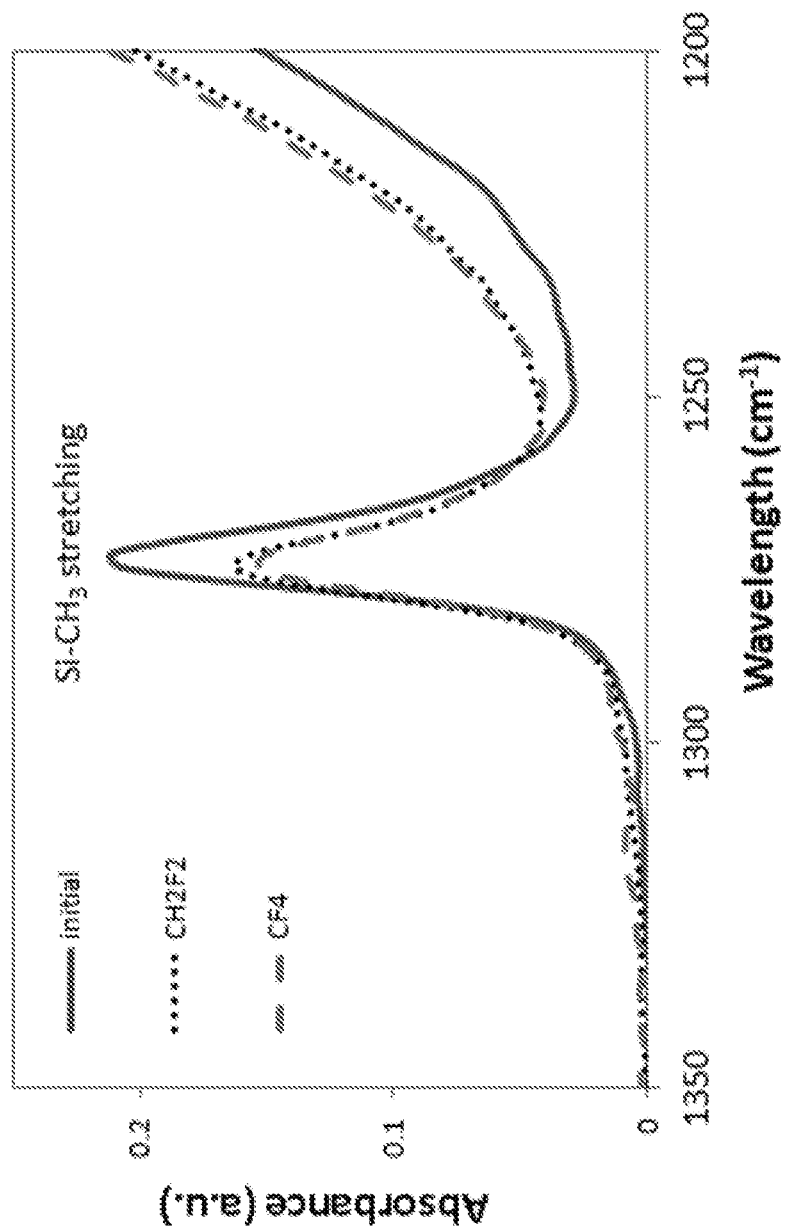
FIG. 13 is a graph showing the FTIR spectra of the low k wafer at approximately 1350-1200 $cm^{-1}$ before and after etching by $CH_2F_2$ and $CF_4$.

The FTIR spectra of the low k wafer were taken before and after etching. FIG. 13 is a graph showing the FTIR spectra of the low k wafer at approximately 1350-1200 $cm^{-1}$ before and after etching by $CH_2F_2$ and $CF_4$. The peak at approximately 1270 $cm^{-1}$ is for Si—$CH_3$. As can be seen in FIG. 13, $CH_2F_2$ impacts the Si—$CH_3$ peak as much as $CF_4$, notwithstanding any polymer formation. As shown in Example 2, $CF_4$ produces more carbon loss in the low k film than the disclosed N-containing etching compositions. As a result, the disclosed N-containing etching compositions are less damaging to the low k films than both $CF_4$ and $CH_2F_2$.

Figure 14:
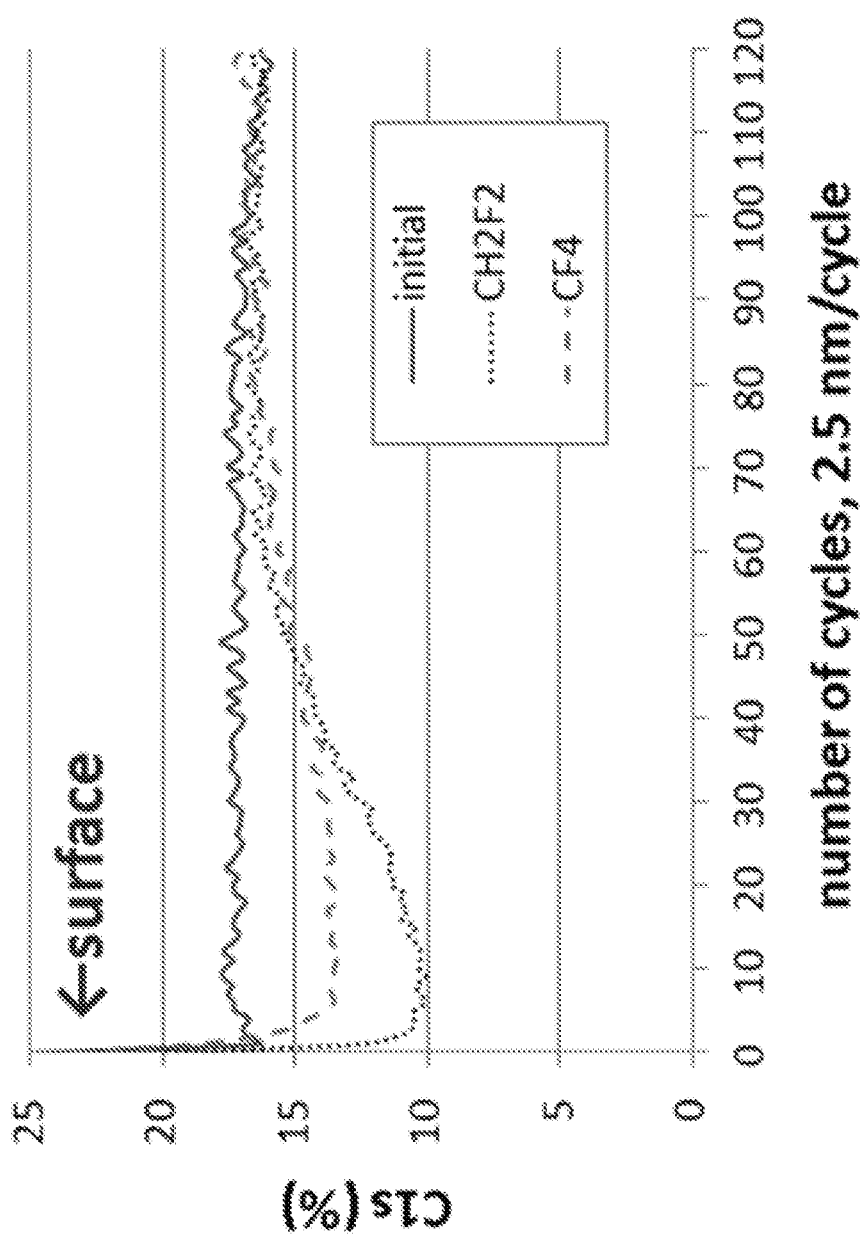
FIG. 14 is an XPS graph demonstrating the percent $C_1$ before and after etching of a low k layer by $CH_2F_2$ and $CF_4$.

The low k wafers were also analyzed by XPS. FIG. 14 is an XPS graph demonstrating the percent C1 before and after etching of a low k layer by $CH_2F_2$ and $CF_4$. The XPS analysis was performed by repeated ion sputtering of the low k layer at 2.5 nm/cycle. In FIG. 14, the y-axis represents the percentage of Carbon and the x-axis represents the number of ion sputtering cycles, at 2.5 nm/cycle.

The thickness of the damaged layer may be determined by determining the number of cycles until the carbon percentage returns to the same level as the carbon percentage in the pristine film. As can be seen in FIG. 14, $CH_2F_2$ produces more carbon loss than $CF_4$, once again demonstrating that the polymer layer deposited by $CH_2F_2$ does not protect the underlying low k layer.

Etching experiments were performed on a patterned wafer having, from top down, a silicon nitride etch stop and low k layer on a Si substrate using the same reactor conditions as were used above on the planar wafers to determine sidewall damage of the low k layer. Only half of the low k layer was etched. Damage was measured using a SEM to measure the difference in the trench width before and after HF dipping divided by two [i.e., sidewall damage in nm=(pre HF width−post HF width)/2]. The averaged sidewall damage was 23 nm using $CF_4$ and 24 nm using $CH_2F_2$.

In summary, the evaluation of the dry etching of low k films with nitrogen containing etching composition plasmas shows that the disclosed nitrogen containing etching compositions yield improved selectivity for mask and etch stop versus low k films than the prior art fluorocarbons, as well as less sidewall damage. The reason for the less sidewall damage is due to the formation of a protective polymer having N therein on the etched surface.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A method for minimizing sidewall damage during a low k etch process to a difference of less than 11 nm before and after a HF rinse, the method comprising the steps of:
   depositing a patterned mask layer on a low k layer, the patterned mask layer having an opening that defines an area to produce an aperture in the low k layer;
   etching the low k layer with a plasma activated vapor of a nitrogen containing etching composition to produce the aperture in the low k layer, the aperture having a first defined sidewall width, wherein the nitrogen containing etching composition comprises an oxidizer and an organofluorine compound having a formula $R_{(3-x)}$—N—$H_x$, wherein x=1-2 and each R independently has the formula $H_aF_bC_c$ with a=1-1, b=0-11, and c=0-5; and
   removing plasma-induced damage from the aperture to produce a second defined sidewall width, a difference between the first and second defined sidewall widths ranging between 0 nm to 11 nm.

2. The method of claim 1, wherein the low k layer has the formula $Si_wO_xC_yH_z$, wherein w ranges from 0.01 to 1, x ranges from 0.01 to 1, y ranges from 0.01 to 1, and z ranges from 0.01 to 1.

3. The method of claim 2, wherein after the low k etch process the low k layer has an increased dielectric constant between 2.0 and 3.5.

4. The method of claim 1, wherein the organofluorine compound has the formula: $R_{(3-a)}$—N—$H_a$, wherein a=1-2 and R independently has the formula $H_aF_bC_c$ with a=1-11, b=1-11, and c=1-5.

5. The method of claim 4, wherein the organofluorine compound is 2,2,2-trifluoroethylamine ($C_2H_4F_3N$), 2,2,3,3,3-pentafluoropropylamine ($C_3H_4F_5N$), 2,2,3,3,4,4,4-heptafluorobutylamine ($C_4H_4F_7N$), 1,1,1,3,3,3-hexafluoroisopropylamine ($C_3H_3F_6N$), or bis(2,2,2-trifluoroethyl)amine ($C_4H_5F_6N$).

6. The method of claim 1, wherein the oxidizer is selected from $O_2$, $O_3$, CO, $CO_2$, COS, $SO_2$, or combinations thereof.

7. The method of claim 1, wherein the oxidizer is $O_2$.

8. The method of claim 1, wherein the oxidizer is $O_3$.

* * * * *